United States Patent
Saldana et al.

(10) Patent No.: US 6,585,572 B1
(45) Date of Patent: Jul. 1, 2003

(54) SUBAPERTURE CHEMICAL MECHANICAL POLISHING SYSTEM

(75) Inventors: Miguel A. Saldana, Fremont, CA (US);
John M. Boyd, Atascadero, CA (US);
Yehiel Gotkis, Fremont, CA (US);
Aleksander A. Owczarz, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/644,135

(22) Filed: Aug. 22, 2000

(51) Int. Cl.$^7$ ................................................. B24B 1/00
(52) U.S. Cl. ..................... 451/67; 451/291; 451/286; 451/285
(58) Field of Search .................. 451/41, 285–289, 451/57, 67, 291, 135, 211, 271, 329

(56) References Cited

U.S. PATENT DOCUMENTS

| | | |
|---|---|---|
| 3,254,454 A | 6/1966 | Cetrangolo |
| 3,564,776 A | 2/1971 | Aspden |
| 3,589,078 A | 6/1971 | Bala et al |
| 3,874,123 A | 4/1975 | Hopkins et al. |
| 3,979,239 A | 9/1976 | Walsh |
| 4,128,968 A | 12/1978 | Jones |
| 4,144,099 A | 3/1979 | Edmonds et al. |
| 4,197,676 A | 4/1980 | Sauerland |
| 4,232,485 A | 11/1980 | Eadon-Allen |
| 4,244,775 A | 1/1981 | D'Asaro |
| 4,358,338 A | 11/1982 | Downey et al. |
| 4,403,453 A | 9/1983 | Cave et al. |
| 4,419,848 A | 12/1983 | Dischert |
| 4,462,860 A | 7/1984 | Szmanda |
| 4,600,469 A | 7/1986 | Fusco et al. |
| 4,671,851 A | 6/1987 | Beyer et al. |
| 4,693,036 A | 9/1987 | Mori |

(List continued on next page.)

FOREIGN PATENT DOCUMENTS

| | | |
|---|---|---|
| EP | 0 331 747 A1 | 3/1981 |
| EP | 0 055 782 A1 | 1/1982 |

(List continued on next page.)

OTHER PUBLICATIONS

Weiderman and Kamenoff, "Hartstone Uniprocessor Benchmark: Definitions and Experiments for Real–Time Systems", p. 353–382, Journal of Real–Time Systems 4, (1992), The Netherlands.

M. Levy, "At last: benchmarks you can believe", p. 59, 60, 62, 64, 66, 67, and 68, (PCT 230) Electrical Design News, (Nov. 1998), Newton, MA.

U. Schmid, "Monitoring Distributed Real–Time Systems", p. 33–56, 8359 Real–Time Systems, (Jul. 1994), No. 1, Dordrecht, NE.

*Primary Examiner*—George Nguyen
(74) *Attorney, Agent, or Firm*—Martine & Penilla, LLP

(57) ABSTRACT

A chemical mechanical polishing (CMP) system is provided. A carrier has a top surface and a bottom region. The top surface of the carrier is designed to hold and rotate a wafer having a one or more formed layers to be prepared. A preparation head is also included and is designed to be applied to at least a portion of the wafer that is less than an entire portion of the surface of the wafer. Preferably, the preparation head and the carrier are configured to rotate in opposite directions. In addition, the preparation head is further configured to oscillate while linearly moving from one of the direction of a center of the wafer to an edge of the wafer and from the edge of the wafer to the center of the wafer so as to facilitate precision controlled removal of material from the formed layers of the wafer.

22 Claims, 14 Drawing Sheets

U.S. PATENT DOCUMENTS

| | | | |
|---|---|---|---|
| 4,789,648 A | | 12/1988 | Chow et al. |
| 4,793,895 A | | 12/1988 | Kaanta et al. |
| 4,879,258 A | | 11/1989 | Fisher |
| 4,956,944 A | | 9/1990 | Ando et al. |
| 5,104,421 A | | 4/1992 | Takizawa et al. |
| 5,177,908 A | | 1/1993 | Tuttle |
| 5,287,663 A | | 2/1994 | Pierce et al. |
| 5,486,129 A | | 1/1996 | Sandhu et al. |
| 5,508,077 A | | 4/1996 | Chen et al. |
| 5,527,423 A | | 6/1996 | Neville et al. |
| 5,542,874 A | | 8/1996 | Chikaki |
| 5,547,417 A | | 8/1996 | Breivogel et al. |
| 5,599,423 A | | 2/1997 | Parker et al. |
| 5,631,839 A | | 5/1997 | Lemoine |
| 5,651,724 A | * | 7/1997 | Kimura et al. ............... 451/41 |
| 5,665,201 A | | 9/1997 | Sahota |
| 5,672,095 A | | 9/1997 | Morimoto et al. |
| 5,735,731 A | * | 4/1998 | Lee ........................... 451/143 |
| 5,762,544 A | | 6/1998 | Zuniga et al. |
| 5,816,895 A | * | 10/1998 | Honda ........................ 451/41 |
| 5,827,112 A | * | 10/1998 | Ball ............................ 451/21 |
| 5,860,851 A | | 1/1999 | Beppu et al. |
| 5,888,120 A | | 3/1999 | Doran |
| 5,899,798 A | | 5/1999 | Trojan et al. |
| 5,919,082 A | | 7/1999 | Walker et al. |
| 5,931,722 A | | 8/1999 | Ohmi et al. |
| 5,944,582 A | | 8/1999 | Talieh |
| 5,951,368 A | | 9/1999 | Watanabe et al. |
| 5,957,763 A | | 9/1999 | Anderson, III et al. |
| 5,958,148 A | | 9/1999 | Halzapfel et al. |
| 5,961,369 A | | 10/1999 | Bartels et al. |
| 5,969,521 A | | 10/1999 | Kurita et al. |
| 5,972,162 A | | 10/1999 | Cesna |
| 5,974,681 A | | 11/1999 | Gonzalez-Martin et al. |
| 5,975,094 A | | 11/1999 | Shurtliff |
| 5,975,986 A | | 11/1999 | Allen et al. |
| 5,975,991 A | | 11/1999 | Karlsrud |
| 5,980,366 A | | 11/1999 | Waddle et al. |
| 5,980,769 A | | 11/1999 | Yanagisawa et al. |
| 5,985,094 A | | 11/1999 | Mosca |
| 5,989,104 A | | 11/1999 | Kim et al. |
| 5,993,289 A | | 11/1999 | Allen et al. |
| 5,993,302 A | | 11/1999 | Chen et al. |
| 5,997,390 A | | 12/1999 | Hosé |
| 6,001,005 A | | 12/1999 | Anderson, III et al. |
| 6,012,964 A | | 1/2000 | Arai et al. |
| 6,012,970 A | | 1/2000 | Nagabushnam et al. |
| 6,022,807 A | | 2/2000 | Lindsey, Jr. et al. |
| 6,030,280 A | | 2/2000 | Fruitman |
| 6,030,488 A | | 2/2000 | Izumi et al. |
| 6,033,521 A | | 3/2000 | Allen et al. |
| 6,038,082 A | | 3/2000 | Takatsuki |
| 6,039,638 A | | 3/2000 | Nagayama et al. |
| 6,040,244 A | | 3/2000 | Arai et al. |
| 6,041,465 A | | 3/2000 | Yashiki et al. |
| 6,042,459 A | * | 3/2000 | Honda ........................ 451/274 |
| 6,045,431 A | | 4/2000 | Cheprasov et al. |
| 6,048,259 A | | 4/2000 | Asai |
| 6,056,632 A | | 5/2000 | Mitchel et al. |
| 6,058,950 A | | 5/2000 | Fujii et al. |
| 6,059,636 A | | 5/2000 | Inaba et al. |
| 6,062,949 A | | 5/2000 | Yashiki et al. |
| 6,062,954 A | | 5/2000 | Izumi |
| 6,066,230 A | | 5/2000 | Arai |
| 6,068,545 A | | 5/2000 | Arai |
| 6,074,275 A | | 6/2000 | Yashiki et al. |
| 6,074,277 A | | 6/2000 | Arai |
| 6,089,961 A | | 7/2000 | Cesna et al. |
| 6,093,081 A | * | 7/2000 | Nyui et al. ............... 451/6 |
| 6,093,087 A | | 7/2000 | Hakomori et al. |
| 6,095,900 A | | 8/2000 | Fruitman et al. |
| 6,102,779 A | | 8/2000 | Cesna et al. |
| 6,102,784 A | | 8/2000 | Lichner |
| 6,106,369 A | * | 8/2000 | Konishi et al. ............... 451/41 |
| 6,106,379 A | | 8/2000 | Mosca |
| 6,106,662 A | | 8/2000 | Bibby, Jr. et al. |
| 6,110,026 A | | 8/2000 | Arai |
| 6,113,465 A | | 9/2000 | Kim et al. |
| 6,113,468 A | | 9/2000 | Natalicio |
| 6,113,478 A | | 9/2000 | Anderson, III et al. |
| 6,120,349 A | * | 9/2000 | Nyui et al. ............... 451/21 |
| 6,139,400 A | | 10/2000 | Sato et al. |
| 6,155,913 A | | 12/2000 | Quek |
| 6,162,112 A | | 12/2000 | Miyazaki et al. |
| 6,257,953 B1 | | 7/2001 | Gitis et al. |
| 6,270,392 B1 | | 8/2001 | Hayashi et al. |
| 6,312,320 B2 | | 11/2001 | Sato et al. |
| 6,402,588 B1 | | 6/2002 | Matsuo et al. |

FOREIGN PATENT DOCUMENTS

| | | | |
|---|---|---|---|
| EP | 0 150 074 A2 | 7/1985 | |
| EP | 0 180 175 A2 | 5/1986 | |
| EP | 0223920 A2 | 7/1986 | |
| EP | 0 272 531 A1 | 6/1988 | |
| EP | 0 272 531 B1 | 6/1988 | |
| EP | 5-138325 | 3/1993 | |
| EP | 0 865 874 | 3/1998 | |
| EP | 0 860 237 A2 | 8/1998 | ........... B24B/37/04 |
| EP | 0 950 468 A2 | 10/1999 | ........... B24B/37/04 |
| EP | 2000015557 | 1/2000 | |
| GB | 2324 750 A | 4/1998 | |
| GB | 2 345 013 A | 6/2000 | |
| JP | 53-68493 | 6/1978 | |
| JP | 56-140632 | 11/1981 | |
| JP | WO 82/03038 | 9/1982 | |
| JP | 57-170538 | 10/1982 | |
| JP | 7-45565 | 2/1995 | |
| JP | 7-111256 | 4/1995 | |
| JP | 7-266220 | 10/1995 | |
| JP | H11-156711 | 6/1999 | |
| JP | 11-31671 | 11/1999 | |
| JP | 11-300625 | 11/1999 | |
| JP | 2000-15557 | 1/2000 | |
| JP | 2000011601 | 1/2000 | |
| WO | WO 9740525 | 10/1997 | |
| WO | WO 01/54862 | 8/2001 | |

* cited by examiner

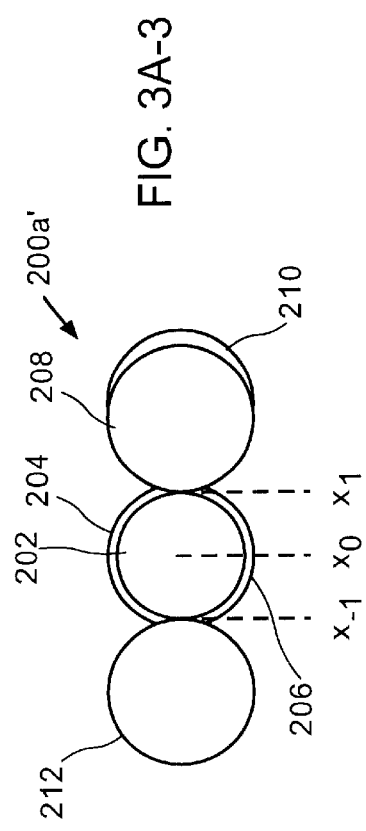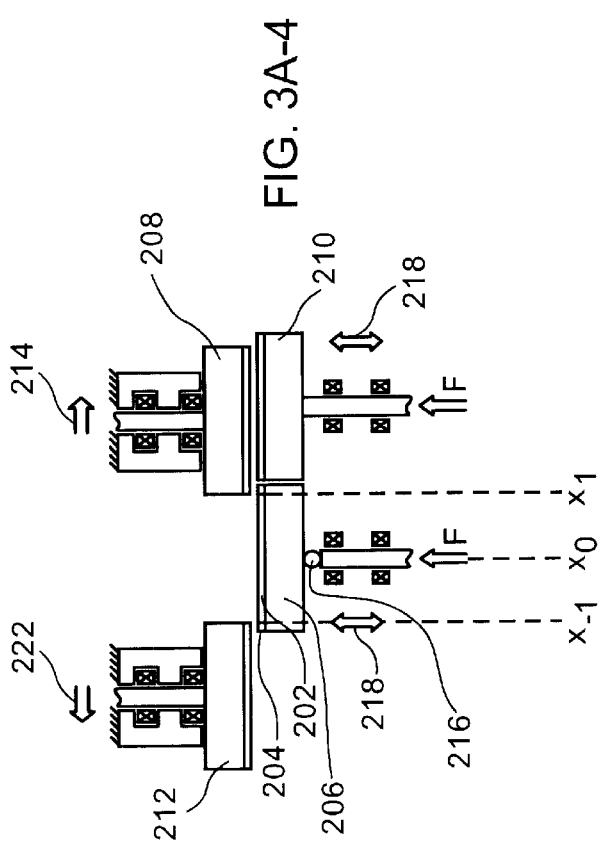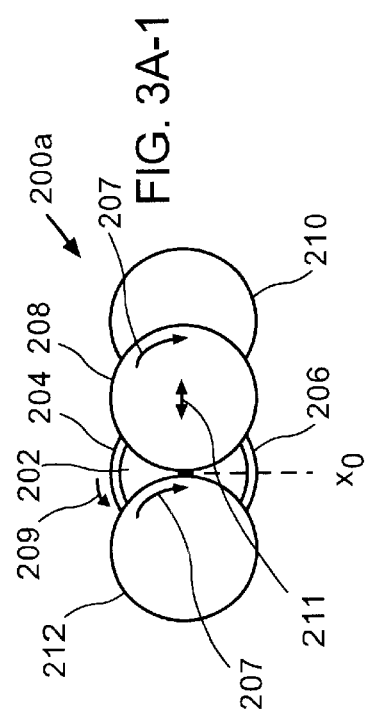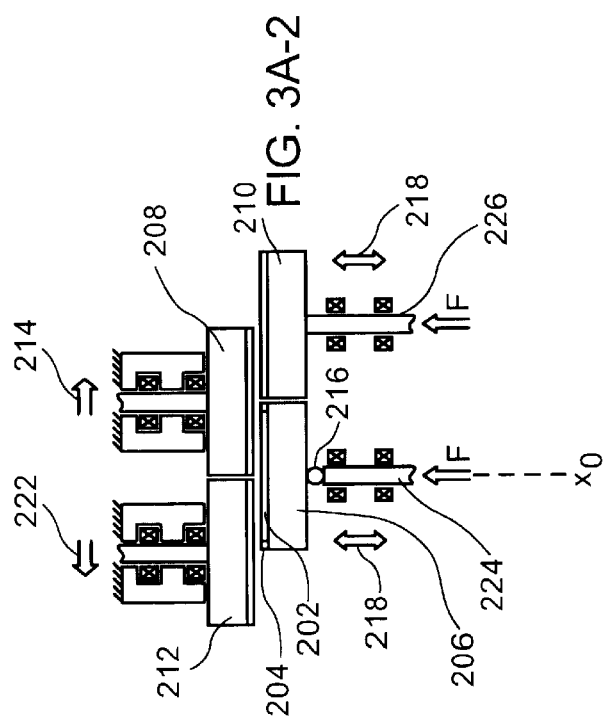

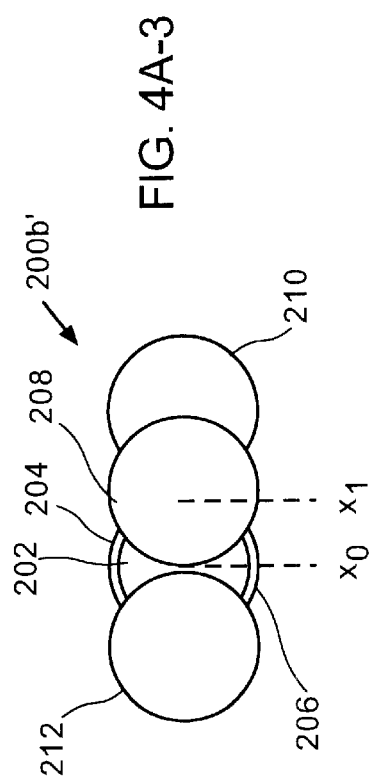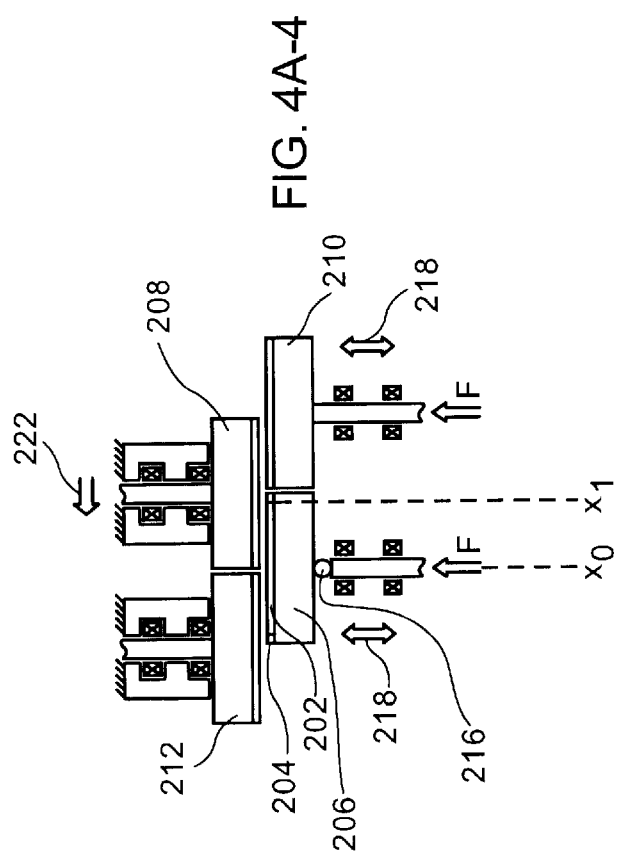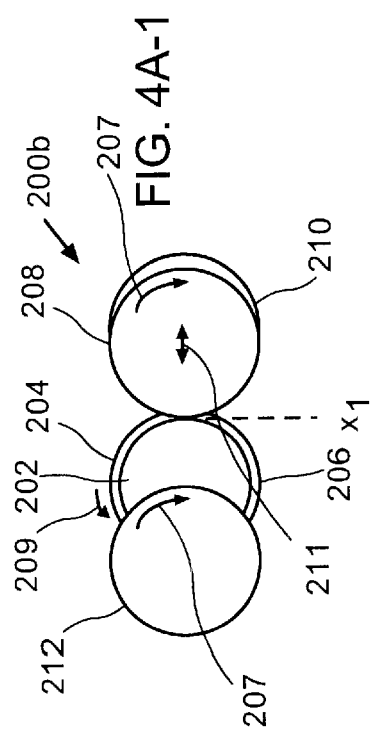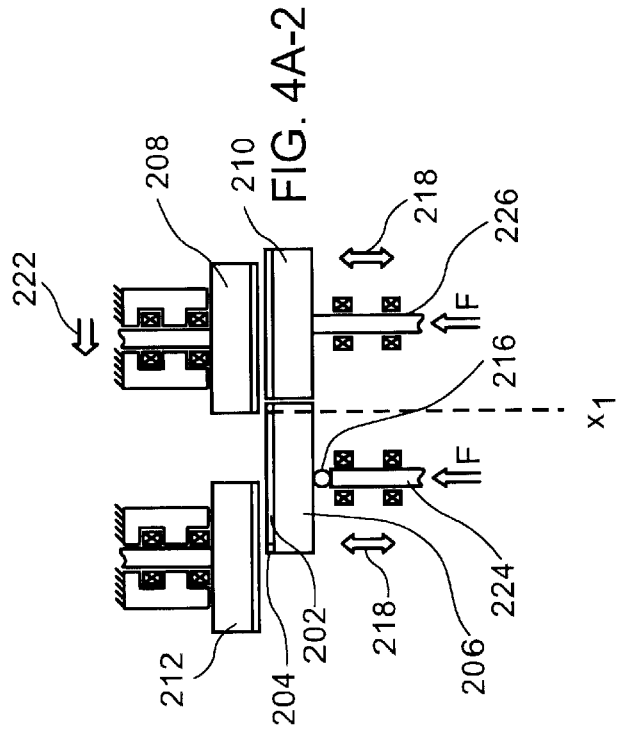

SUBAPERTURE CHEMICAL MECHANICAL POLISHING SYSTEM

BACKGROUND OF THE INVENTION

1. Field of the Invention

The present invention relates generally to chemical mechanical polishing (CMP) systems and techniques for improving the performance and effectiveness of CMP operations. Specifically, the present invention relates to a wafer carrier utilized in a subaperture CMP system.

2. Description of the Related Art

In the fabrication of semiconductor devices, there is a need to perform CMP operations, including polishing, buffing and wafer cleaning. Typically, integrated circuit devices are in the form of multi-level structures. At the substrate level, transistor devices having diffusion regions are formed. In subsequent levels, interconnect metallization lines are patterned and electrically connected to the transistor devices to define the desired functional device. As is well known, patterned conductive layers are insulated from other conductive layers by dielectric materials, such as silicon dioxide. As more metallization levels and associated dielectric layers are formed, the need to planarize the dielectric material increases. Without planarization, fabrication of additional metallization layers becomes substantially more difficult due to the higher variations in the surface topography. In other applications, metallization line patterns are formed in the dielectric material, and then metal CMP operations are performed to remove excess metallization.

In the prior art, CMP systems typically implement belt, orbital, or brush stations in which belts, pads, or brushes are used to scrub, buff, and polish one or both sides of a wafer. Slurry is used to facilitate and enhance the CMP operation. Slurry is most usually introduced onto a moving preparation surface, e.g., belt, pad, brush, and the like, and distributed over the preparation surface as well as the surface of the semiconductor wafer being buffed, polished, or otherwise prepared by the CMP process. The distribution is generally accomplished by a combination of the movement of the preparation surface, the movement of the semiconductor wafer and the friction created between the semiconductor wafer and the preparation surface.

In a typical CMP system, a wafer is mounted on a carrier, which rotates in a direction of rotation. The CMP process is achieved when the exposed surface of the rotating wafer is applied with force against a polishing pad, which moves or rotates in a polishing pad direction. Some CMP processes require that a significant force be used at the time the rotating wafer is being polished by the polishing pad.

Normally, the polishing pads used in the CMP systems are composed of porous or fibrous materials. However, in some CMP systems, the polishing pads may contain fixed abrasive particles throughout their surfaces. Depending on the form of the polishing pad used, a slurry composed of an aqueous solution such as $NH_4OH$ or DI water containing dispersed abrasive particles may be applied to the polishing pad, thereby creating an abrasive chemical solution between the polishing pad and the wafer.

Several problems may be encountered while using a typical CMP system. One recurring problem is called "edge-effect," which is caused when the CMP system polishes the edge of the wafer at a different rate than other regions, thereby causing a non-uniform profile on the surface of the wafer. The problems associated with edge-effect can be divided to two distinct categories. The first category relates to the so-called "pad rebound effect" caused as a result of the initial contact of the polishing pad with the edge of the wafer. The second category will be described below.

FIG. 1A is an illustration of the pad rebound effect associated with the prior art. A wafer 202 is mounted on a carrier 100. Subsequently, the wafer 202 is applied against the pad surface 102 with a force F to accomplish a CMP process. At a certain point in time, the pad surface 102 contacts the edge of the wafer 202 at an edge contact zone 104c, and the pad surface is shown bouncing off the edge of the wafer, thereby creating a non-contact zone 104a. Thereafter, the pad surface comes into contact with the wafer 202 at a contact zone 104b. However, the pad surface 102 bounces off the surface of the wafer 202 again, so as to create another non-contact zone 104a. Then, once more the pad surface comes into contact with the wafer 202 at another contact zone 104b. However, it bounces off again. Thus, the regions of the wafer 202, which came into contact with the pad surface 102 like the contact zones 104b, are polished more than other regions. As a result, the CMP processed wafer will tend to show a non-uniform profile.

The "burn-off" effect, which constitutes the second category of problems associated with the edge-effect is shown in FIG. 1B. As illustrated, the burn-off effect occurs when the sharper edge of a wafer 202 is excessively polished as it makes contact with the pad surface 102 (e.g., at the edge contact zone 104c). This happens because a considerable amount of pressure is exerted on the edge of the wafer 202 as a result of the surface pad 102 applying the force F on an infinitely small contact area defined as the edge contact zone 104c. As a consequence of the burn-off effect, the edge of the resulting polished wafers exhibit a burn ring that renders the edge region unusable, thereby wasting silicon device area.

Another shortcoming of conventional CMP systems is their inability to polish the surface of the wafer 202 along a desired finishing layer profile. Ordinarily, the surface of a wafer 202 that has undergone some fabrication tends to be of a different thickness in the center region and varies in thickness out to the edge. As illustrated in FIG. 1C-1, in a typical conventional CMP system, the pad surface 102, which covers the entire wafer surface, is designed to apply a force on a finishing layer 202a surface. As a result, all the regions of the finishing layer 202a are polished until the finishing layer 202a is substantially flat. Thus, as shown in FIG. 1C-2, the pad surface 102 polishes the finishing layer 202a, irrespective of its wavy profile, thereby causing the thickness of the finishing layer 202a to be non-uniform (i.e., at points $202a_1$, $202a_2$, $202a_3$, and $202a_4$). As is well known, some circuit fabrication applications require that a certain thickness of material be maintained in order to build a working device. For instance, if the finishing layer 202a were a dielectric layer, a certain thickness would be needed in order to define metal lines and conductive vias therein.

In view of the foregoing, a need therefore exists in the art for a chemical mechanical polishing system that enables precision and controlled polishing of specifically targeted wafer surface regions, while substantially eliminating damaging edge-effects, pad rebound effects, and edge burn-off effects.

SUMMARY OF THE INVENTION

Broadly speaking, the present invention fills these needs by providing a system which implements precision controlled polishing of layer surfaces of a wafer. In one implementation, the CMP system can be made to follow the topography of the layer surfaces of the wafer so as to create a layer surface, which has a uniform thickness throughout. In a preferred embodiment, the CMP system is designed to implement a rotating carrier in a subaperture polishing configuration, thereby eliminating the above-mentioned drawbacks, edge-effects, pad rebound effects, and edge burn-off effects. It should be appreciated that the present invention can be implemented in numerous ways, including as a process, an apparatus, a system, a device, or a method. Several inventive embodiments of the present invention are described below.

In one embodiment, a chemical mechanical polishing (CMP) system is disclosed. The CMP system includes a carrier, which has a top surface and a bottom region. The top surface of the carrier is designed to hold and rotate a wafer having a one or more formed layers to be prepared. Further included is a preparation head, which is designed to be applied to at least a portion of the wafer that is less than an entire portion of the surface of the wafer.

In another embodiment, a chemical mechanical polishing (CMP) system is disclosed. A carrier is designed to hold and rotate a substrate at a fixed location. The carrier includes a surface to be prepared. Also included is a primary head. The primary head is designed to move over the fixed location of the rotating carrier in one of a first direction or a second direction. A first direction begins at about the center of the surface to an edge of the surface, and a second direction begins at about the edge of the surface to about the center of the surface. The primary head is further designed to be applied to at least a portion of the surface, which is less than an entire portion of the surface.

In still a further embodiment, a chemical mechanical polishing (CMP) system is disclosed. The CMP system includes a carrier having a top surface and a bottom region. The top surface of the carrier is designed to hold and rotate a wafer, which has one or more formed layers to be prepared. Also included is a preparation head designed to be applied to at least a portion of the surface of the wafer that is less than an entire portion of the surface of the wafer. Further included is a conditioning head positioned beside the carrier. The conditioning head is designed to have a conditioning surface that is substantially planer with a top surface of the wafer. The conditioning head is further designed to deliver the preparation head as the preparation head is moved onto the top surface of the wafer. Alternatively, the conditioning head is designed to receive the preparation head as the preparation head is moved onto the conditioning head.

The advantages of the present invention are numerous. Primarily, rather than polishing all the regions of the surface of a wafer until the surface of the wafer is substantially flat, the subaperture CMP system, precisely and controllably, polishes specifically targeted wafer surface regions. Thus, in one embodiment, the CMP system can be made to follow the topography of the finishing layer, thereby creating a finishing layer having a uniform thickness throughout. In addition, the subaperture configuration of the CMP system in conjunction with the carrier implemented, substantially eliminate the edge-effects, pad rebound effects and edge burn-off effects associated with the prior art. Further advantages associated with the subaperture CMP, system include, without limitations, substantially lower footprint, machine volume, and cost of ownership.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1C-2 is a cross-sectional view of a typical post-CMP wafer.

FIG. 2A-1 is a plan-view of a subaperture CMP system, in accordance with one embodiment of the present invention.

FIG. 2A-2 is a cross-sectional view of a subaperture CMP system, illustrating the co-planer relationship of the retainer ring and the wafer, in accordance with another embodiment of the present invention.

FIG. 2A-3 is a plan-view of a subaperture CMP system, illustrating the movement of the primary head from the center of the wafer to the edge of the wafer, in accordance with yet another embodiment of the present invention.

FIG. 2A-4 is a cross-sectional view of a subaperture CMP system, revealing the fixed position of the secondary head, in accordance with still another embodiment of the present invention.

FIG. 2B-1 is a diagram of a contact area at a time when the edge of the primary head is positioned at a center of the wafer, according to one embodiment of the present invention.

FIG. 2B-2 is a diagram of a contact area at a time when the primary head has moved away from the center of the wafer, according to another embodiment of the present invention.

FIG. 2B-3 is a diagram of a contact area when the primary head is approaching an edge of the wafer, according to yet another embodiment of the present invention.

FIG. 3A-1 is a plan-view of a subaperture CMP system, illustrating the respective positions of the primary head and the secondary head relative to the carrier, in accordance with still another embodiment of the present invention.

FIG. 3A-2 is a cross-sectional view of a subaperture CMP system, revealing the co-planer relationship of the retainer ring and the carrier as well as the position of the edge of the primary head at the center of the wafer and the head of the secondary head positioned slightly to the left of the center of the wafer, according to yet another embodiment of the present invention.

FIG. 3A-3 is a plan-view of a subaperture CMP system, illustrating the linear movements of the primary head and the secondary head in the opposite directions.

FIG. 3A-4 is a cross-sectional view of a subaperture CMP system, depicting the non-stationary position of the secondary head, in accordance with yet another embodiment of the present invention.

FIG. 4A-1 is a plan-view of a subaperture CMP system, wherein the edge of the primary head is positioned at the edge of the wafer while the edge of the secondary head is positioned at the center of the wafer, according to still another embodiment of the present invention.

FIG. 4A-2 is a cross-sectional view of a subaperture CMP system, revealing the stationary position of the secondary head from a linear movement standpoint, according to yet another embodiment of the present invention.

FIG. 4A-3 is a plan-view of a subaperture CMP system, wherein the edge of the primary head has linearly moved from the edge of the wafer to the center of the wafer, according to still another embodiment of the present invention.

FIG. 4A-4 is a cross-sectional view of a subaperture CMP system, depicting the linear movement of the primary head and the fixed position of the secondary head from a linear movement standpoint, in accordance with yet another embodiment of the present invention.

FIG. 5A-1 is a plan-view of a subaperture CMP system revealing the respective positions of the primary head and the secondary head relative to the carrier, in accordance with still another embodiment of the present invention.

FIG. 5A-2 is a cross-sectional view of a subaperture CMP system, wherein the primary head and secondary head are depicted to be located on the opposite edges of the wafer, according to yet another embodiment of the present invention.

FIG. 5A-3 is a plan-view of a subaperture CMP system, wherein the primary head and the secondary head have linearly moved from the opposite edges of the wafer to the center of the wafer, according to yet another embodiment of the present invention.

FIG. 5A-4 is a cross-sectional view of a subaperture CMP system, depicting the linear movements of the primary head and the secondary head, in accordance still another embodiment of the present invention.

FIG. 6A-1 is a plan-view of a subaperture CMP system, wherein the edge of the primary head and the edge of the secondary head are positioned at the center of the wafer, in accordance with yet another embodiment of the present invention.

FIG. 6A-2 is a cross-sectional view of a subaperture CMP system depicting the positions of the edges of the primary head and the secondary head at about the center of the wafer, according to yet another embodiment of the present invention.

FIG. 6A-3 is a plan-view of a subaperture CMP system, wherein the primary head and the secondary head have linearly moved in the same direction, in accordance with yet another embodiment of the present invention.

FIG. 6A-4 is cross-sectional view of a subaperture CMP system, illustrating the linear movements of the primary head and the secondary head in the same direction, according to still another embodiment of the present invention.

FIG. 7A-1 is a plan-view of a subaperture CMP system, depicting the respective positions of the edges of the primary head and the secondary head with respect to the carrier, in accordance with yet another embodiment of the present invention.

FIG. 7A-2 is a cross-sectional view of a subaperture CMP system, illustrating the direction of the movement of the primary head and the secondary head, according to still another embodiment of the present invention.

FIG. 7A-3 is a plan-view of a subaperture CMP system, depicting the linear movements of the edges of the primary head and the secondary head from the edge of the wafer to the center of the wafer, in accordance with yet another embodiment of the present invention.

FIG. 7A-4 is a cross-sectional view of a subaperture CMP system, wherein the primary head and the secondary head have linearly moved in the same direction, according to yet another embodiment of the present invention.

FIG. 8A-1 is a plan-view of a subaperture CMP system, wherein a support point has been used to support the wafer, in accordance with yet another embodiment of the present invention.

FIG. 8A-2 is a cross-sectional view of a subaperture CMP system, revealing the position of the support point on the carrier with respect to the primary head, according to yet another embodiment of the present invention.

FIG. 8A-3 is a plan-view of a subaperture CMP system, illustrating the fixed position of the support point as well as the linear movement of the primary edge from the center of the wafer to the edge of the wafer, in accordance with yet another embodiment of the present invention.

FIG. 8A-4 is a cross-sectional view of a subaperture CMP system, wherein the primary head has linearly moved from the center of the wafer to the edge of the wafer, in accordance with still another embodiment of the present invention.

FIG. 9A-1 is a plan-view of a subaperture CMP system utilizing a support point, wherein the edge of the primary head is located at the edge of the wafer, according to still another embodiment of the present invention.

FIG. 9A-2 is a cross-sectional view of a subaperture CMP system utilizing a support point, revealing the location of the edge of the primary head at the edge of the wafer, according to yet another embodiment of the present invention.

FIG. 9A-3 is a plan-view of a subaperture CMP system utilizing a support point, wherein the edge of the primary head has linearly moved from the edge of the wafer to the center of the wafer, in accordance with still another embodiment of the present invention.

FIG. 9A-4 is a cross-sectional view of a subaperture CMP system utilizing a support point, depicting the movement of the primary head in the direction of the edge of the wafer to the center of the wafer, according to yet another embodiment of the present invention.

FIG. 10A-1 is a plan-view of a subaperture CMP system utilizing a plurality of support points, in accordance with yet another embodiment of the present invention.

FIG. 10A-2 is a cross-sectional view of a subaperture CMP system utilizing a plurality of support points, wherein the edge of the primary head is positioned at the center of the wafer, in accordance with yet another embodiment of the present invention.

FIG. 10A-3 is a plan-view of a subaperture CMP system utilizing a plurality of support points, depicting the linear movement of the primary head in the direction of the center of the wafer to the edge of the wafer, according to yet another embodiment of the present invention.

FIG. 10A-4 is a cross-sectional view of a subaperture CMP system utilizing a plurality of support points, wherein the edge of the primary head has moved from the center of the wafer to the edge of the wafer, according to still another embodiment of the present invention.

FIG. 11A-1 is a plan-view of a subaperture CMP system utilizing multiple support points positioned substantially opposite the location of the edge of the primary head, in accordance with yet another embodiment of the present invention.

FIG. 11A-2 is a cross-sectional view of a subaperture CMP system utilizing multiple support points, wherein the edge of the primary head is positioned at the edge of the wafer, in accordance with yet another embodiment of the present invention.

FIG. 11A-3 is a plan-view of a subaperture CMP system utilizing multiple support points, wherein the edge of the primary head has moved from the edge of the wafer to the center of the wafer, in accordance with still another embodiment of the present invention.

FIG. 11A-4 is a cross-sectional view of a subaperture CMP system utilizing multiple support points, depicting the movement of the primary head in the direction of the center of the wafer to the edge of the wafer, according to yet another embodiment of present invention.

DETAILED DESCRIPTION OF THE PREFERRED EMBODIMENTS

An invention for a CMP system, which enables precision controlled polishing of layer surfaces of a wafer, is disclosed. The CMP system substantially eliminates the aforementioned edge-effects, pad rebound effects, and edge burn-off effects, while at the same time effectively controls the degree of polishing over selected regions of the wafer. In preferred embodiments, the CMP system implements a wafer carrier that is implemented in subaperture polishing configurations. The subaperture polishing configuration is herein defined as a configuration, wherein the contact surface of a polishing pad with the wafer can at certain points in time be smaller than the surface of the wafer.

In the following description, numerous specific details are set forth in order to provide a thorough understanding of the present invention. It will be understood, however, to one skilled in the art, that the present invention may be practiced without some or all of these details. In other instances, well known process operations have not been described in detail in order not to unnecessarily obscure the present invention.

Figure 1A:
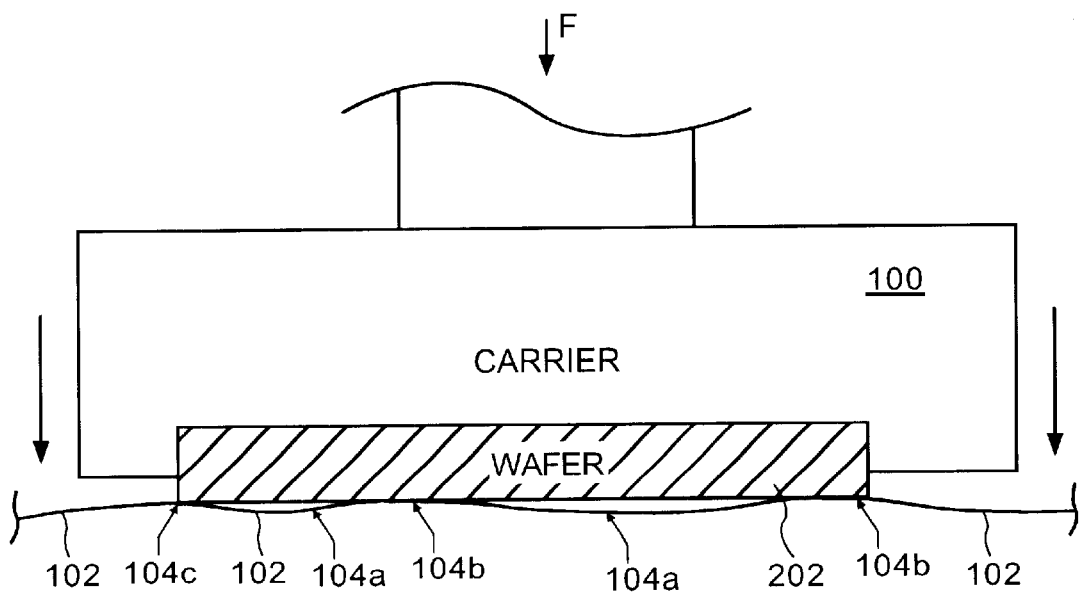
FIG. 1A is an illustration of the pad rebound effect associated with the prior art.
Figure 1B:
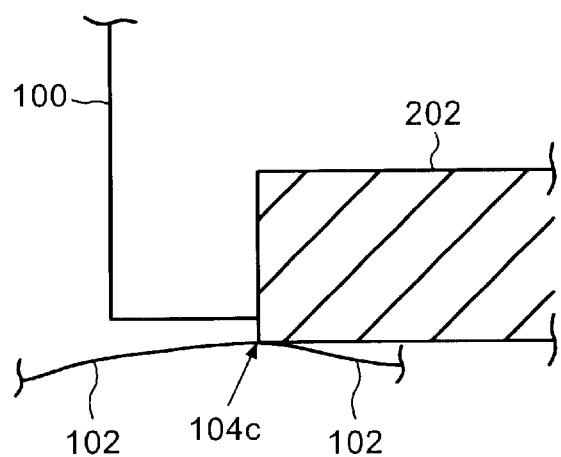
FIG. 1B is an illustration of the edge burn-off effect associated with the prior art.
Figures 1, 1C:
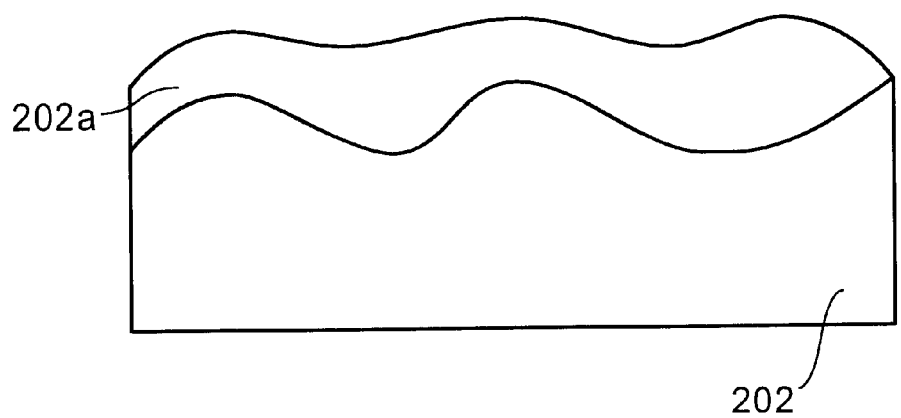
FIG. 1C-1 is a cross-sectional view of a wafer revealing the non-uniform topography of a wafer.
Figures 2, 2A, 3:
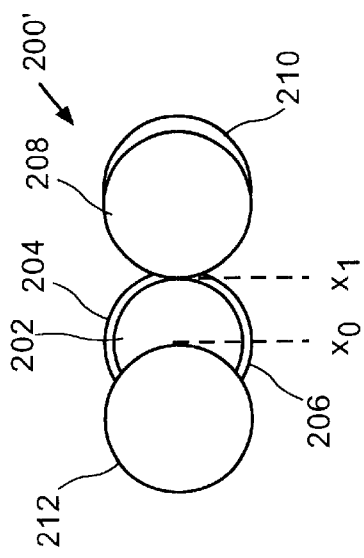

FIG. 2A-1 is a plan view of a subaperture CMP system 200, in accordance with one embodiment of the present invention. The embodiment of FIG. 2A-1 includes a primary head 208, which is configured to polish the surface of a wafer 202. The primary head 208 is designed so as to polish the wafer 202 utilizing any type of polishing pad including, without limitation, Linear Polisher Technology (LPT) pad materials, rotary CMP pad materials, fixed abrasive pad materials, etc. In general, any pad material that enables the desired polishing levels and precision can be used.

The subaperture configuration of the system 200 introduces flexibility into the polishing operation by utilizing different or same removal rates on different regions of the wafer 202. Unlike the conventional CMP system wherein the entire polishing head is in contact with the entire surface of the wafer, in the subaperture CMP system 200, at any given time, the size of the contact surface of the primary head 208 with the wafer 202 may vary. More specifically, in the conventional CMP systems the polishing head applies force on the entire surface of the wafer, thereby removing materials from the entire surface of the wafer so as to create a substantially flat wafer. In contrast, in the subaperture CMP system 200, the primary head 208 applies force only to selected regions of the wafer 202, thereby removing excess materials from those selected portions, exclusively, at a particular time.

Since the wafer contact surface area changes (e.g., where the pad meets the wafer), the removal rate also changes based on the Preston's Equation. According to the Preston's Equation, Removal Rate=KpPV, where the removal rate of material is a function of Downforce (P) and Linear Velocity (V), with Kp being the Preston Coefficient, a constant determined by the chemical composition of the slurry (or fixed abrasive material and chemicals), the process temperature, and the pad surface, among others. Thus, the smaller the contact surface of the primary head 208 and the wafer 202, the greater the removal rate of the surface material. In one embodiment, the ability to control the position of the primary head 208 over the wafer 202 also enables polishing of material along a desired topography of the wafer 202, rather than polishing the entire wafer 202 until a substantially flat surface is achieved.

In this embodiment, a carrier 206 is positioned below the primary head 208 and is configured to engage the wafer 202 using a retainer ring 204. Preferably, the retainer ring 204 is defined so as to maintain a co-planer relationship with the wafer 202 while the wafer 202 is being polished by the primary head 208. The retainer ring 204 is made of a hard material, which can withstand repeated polishing, buffing, and cleaning (i.e., SiC). Preferably, the carrier 206 is oriented in a manner that the exposed surface of the wafer 202 faces the primary head 208. During the polishing, the wafer 202 is configured to rotate in the direction of a wafer rotation 209 while the primary head 208 is designed to rotate in the opposite direction, a direction of preparation 207. In addition to rotating in the direction of preparation 207, the primary head 208 is configured to move back and forth, in a small magnitude, in the direction of oscillation 211 so as to create an oscillating movement. Thus, while rotating, the primary head 208 oscillates in the oscillation direction 211, thereby improving the polishing operation performed on the wafer 202.

In one exemplary implementation, the primary head 208 may be configured to be about the same size as the carrier 206. However, in a different embodiment, preferably, the primary head 208 may be designed so as to be about the same size as the wafer 202. Thus, in the embodiments wherein the size of the primary head 208 and the wafer 202 vary (i.e., the primary head 208 is smaller or larger than the wafer 202), the angular velocity of the carrier 206 can be changed so that the angular velocity of the carrier 206 matches the angular velocity of the primary head 208.

In another embodiment, the subaperture CMP system 200 can include a secondary head 212 positioned to the left of the primary head 208 and above the carrier 206. In this example, the secondary head is configured to provide additional support to the wafer 202 while the wafer 202 is being polished by the primary head 208. In one embodiment, in addition to providing additional support to the wafer, the secondary head 212 can be designed to function as a buffer or a cleaner. The secondary head 212 may be fixed or mobile, and similar to the primary head 208, rotates at an angular velocity in the direction of preparation 207.

In yet another embodiment, a conditioning head 210 may be positioned to the right of the carrier 206 and below the primary head 208 so as to condition the primary head 208. Similar to the primary head 208 and secondary head 212, the conditioning head 210 rotates in the direction of preparation 207.

Initially, in the embodiment of FIG. 2A-1, the edge of the primary head 208 is defined at a position $x_0$, which defines the center of the wafer 202. Thus, the edge of the primary head 208 is positioned at position $x_0$, thereby causing the edge of the secondary head 212 to be located slightly to the left of $x_0$. By positioning the secondary head 212 slightly to the left of $x_0$, it is possible for the primary head 208, which is oscillating in the direction 211, to polish the entire surface of the wafer 202. Accordingly, the primary head 208 will preferably contact the surface of the wafer 202 slightly to the left of $x_0$ in view of the slight oscillation.

Figures 1, 1C, 2:
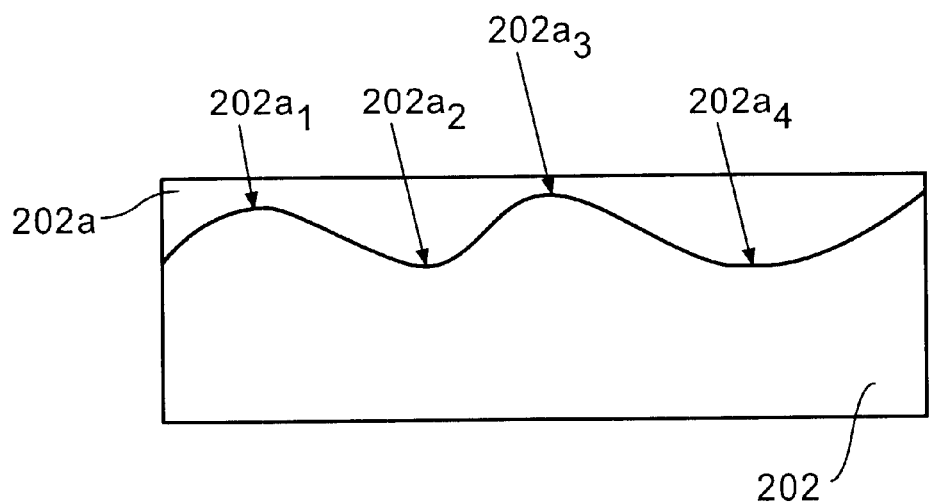

FIG. 2A-2 is a cross-sectional view of the embodiment of FIG. 2A-1, which illustrates the co-planer relationship of the retainer ring 204 and the wafer 202. In a preferred embodiment, a gimbal 216 is positioned underneath the carrier 206 and is defined to align the carrier 206 to the moving primary head 208 or secondary head 212 during the polishing, buffing or cleaning operations. The gimbal 216 is mounted on an extending spindle 224, which rotates in the direction of wafer rotation 209. The extending spindle 224 is configured to apply a force F onto the carrier 206.

Further shown in the embodiment of FIG. 2A-2 is the fixed conditioning head 210 mounted on a conditioning spindle 226. The conditioning spindle 226 is configured to apply the force F onto the conditioning head 210. The carrier 206 and the conditioning head 210 are configured to be moved up and down, along the spindle 224 and conditioning spindle 226 so as to adjust the amount of force F to be applied to the carrier 206 and conditioning head 210.

As depicted, initially, the edge of the primary head 208 is positioned at the position $x_0$ and is configured to linearly move at a movement direction 214. Also shown is the secondary head 212 having its edge positioned slightly to the left of position $x_0$. In this embodiment, the secondary head 212 is configured to be stationary (from a linear movement standpoint). However, the secondary head 212 is preferably rotating along the direction of preparation 207.

FIG. 2A-3 is a plan view of the embodiment of FIG. 2A-1, wherein the edge of the primary head 208 has moved from the position $x_0$ to a position $x_1$, which defines the edge of the wafer in the movement direction 214. FIG. 2A-4 is a cross-sectional view of the subaperture CMP system 200' shown in FIG. 2A-3. As shown, the secondary head 212 has remained stationary.

In this embodiment, the polishing operation started by the edge of the primary head 208 polishing the center of the wafer 202 first. Due to the subaperture configuration of the system, at any given time, the size of the contact areas (i.e., the areas of the wafer 202 being polished by the primary head 208) were different, and thus the removal rates. At the instances when the contact areas were small (i.e., the areas around the position $x_0$) the removal rates were higher. In contrast, on the occasions when the contact areas were larger (i.e., the areas closer to the position $x_1$) the removal rates were lower. However, it must be noted that the amount of materials to be removed depended on the profile of the wafer 202 in the areas being polished.

For example, if the profile of the wafer 202 were initially flat in the areas being polished, the primary head 208 removed excess materials so that a flat polished surface was achieved; however, if the desired profile were not flat, the primary head 208 ensued the profile of the regions being polished while removing the desired amount of material.

Once all the desired amount of material (e.g., surface layer material) were removed from the areas around the center of the wafer 202, the polishing operation was continued by precision controlling the edge of the primary head 208 to a different position, which was farther from the position $x_0$ and closer to the position $x_1$. Accordingly, the primary head 208 left the polishing of the edge of the wafer 202 to the end, thereby allowing the utilization of greater control over the removal of materials from the edge of the wafer 202.

In addition to controlling the removal rate at the edge of the wafer 202, this embodiment also eliminated the edge-effect, pad rebound effect, and edge burn-off effect because the carrier 206 is designed to engage the wafer 202 by utilizing the retainer ring 204. The existing co-planer relationship between the wafer 202 and the retainer ring 204 creates an arrangement, wherein the retainer ring 204 supports the wafer 202 while the wafer 202 is being polished by the primary head 208. Thus, the co-planer arrangement allows the primary head 208 to continue polishing to the very edge of the wafer 202 without falling off the very edge of the wafer 202 or excessively polishing the edge of the wafer 202, as is common in prior art burn-off effect.

It must be noted that the subaperture CMP system 200' performed an improved polishing operation, thereby yielding a better polished wafer 202. Unlike the polishing operations used in the conventional CMP systems, the primary head 208 performed the polishing operation by rotating in the direction of preparation 207, and simultaneously oscillating in the oscillation direction 211.

FIGS. 2B-1, 2B-2, and 2B-3 are illustrations of the differences in size of the contact areas at different instances of time. In one exemplary embodiment of FIG. 2B-1, initially, the edge of the primary head 208 was located at the position $x_0$, the center of the wafer 202, thereby creating a contact area 230. As shown, the primary head 208 intersected the wafer 202 at a point 232a and a point 232b, thereby creating the contact area 230 defined as the area between an arc radial 234 and an arc radial 236.

Subsequently, the edge of the primary head 208 linearly moved farther away from the center of the wafer 202 thus creating a smaller contact area 230'. The implementation of FIG. 2B-2 depicts the contact area 230', defined between an arc radial 232a' and an arc radial 232b' created as a result of the intersection of the primary head 208 and wafer 202 at a point 232a' and 232b'. As depicted in the embodiment of FIG. 2B-3, once the edge of the primary head 208 approximately reached the edge of the wafer 202, a substantially smaller contact area 230" was created. As illustrated, the contact are 230" is the small area created between an arc radial 236" and an arc radial 234", defined between the intersection of the primary head 208 and the wafer 202 at a point 232a" and a point 232b". Accordingly, as the edge of the primary head 208 moved from the position $x_0$ to the position $x_1$, the contact areas became smaller, thereby enabling the primary head 208 to perform a precision polishing operation at the regions substantially close to the edge of the wafer 202. Although the movement of the primary head 208 is described moving from position $x_0$ to $x_1$, it should be apparent to those skilled in the art that the movement can also be from the position $x_1$ to $x_0$, and the position $x_0$ to $x_{-1}$.

Similarly, in the embodiment of FIGS. 3A-1 and 3A-2, the primary head 208 is defined at the position $x_0$, thereby causing the edge of the secondary head 212 to be located slightly to the left of the position $x_0$. In this embodiment, while the secondary head 212 rotates in the direction of preparation 207, it is configured to linearly move in a movement direction 222. As the secondary head 212 moves, the primary head, which is located at the position $x_0$, linearly moves in the opposite direction, the movement direction 214, while oscillating in the direction of oscillation 211. In one preferred embodiment, the secondary head 212 and the primary head 208 may be configured to both move at about the same linear velocity. However, in alternative embodiments, the linear velocity of the primary head 208 and the secondary head 212 can be different and will vary depending upon the desired process recipe.

Figures 2, 2A, 3, 4:
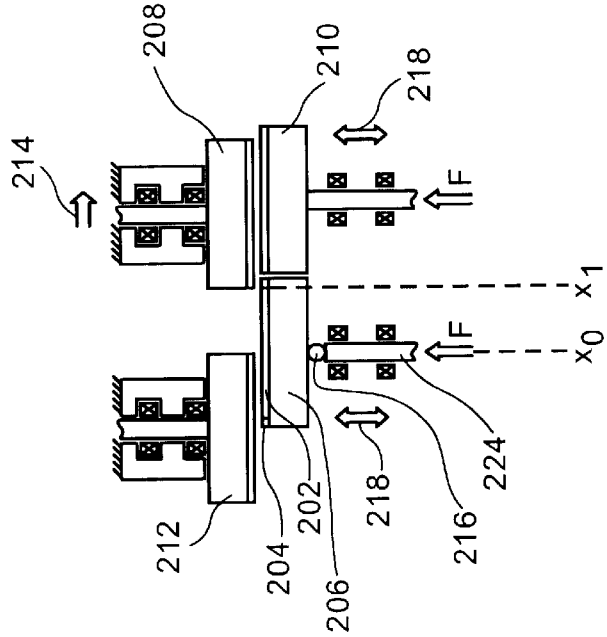
Figures 1, 2A:
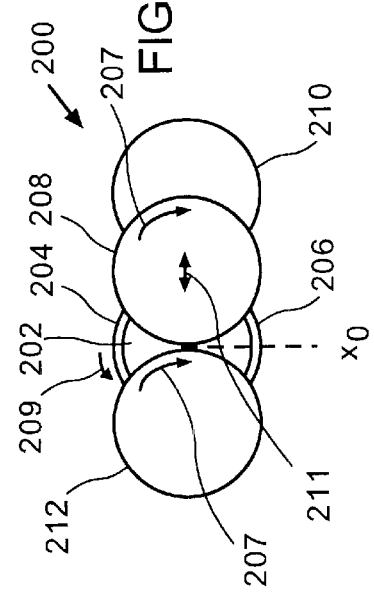
Figures 2, 2A:
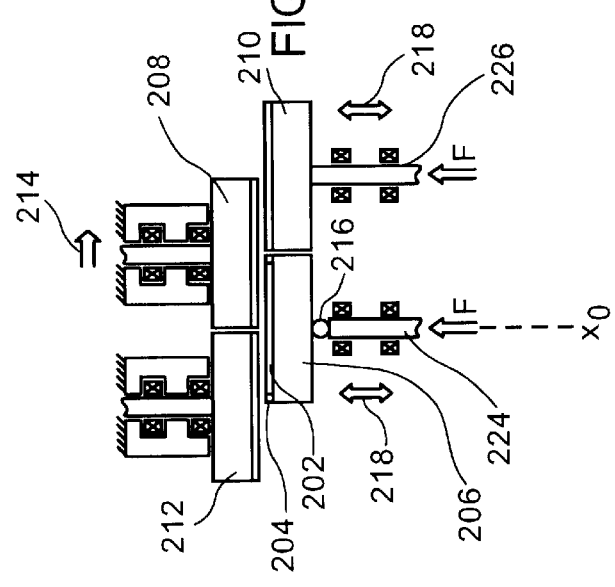
Figures 1, 2B:
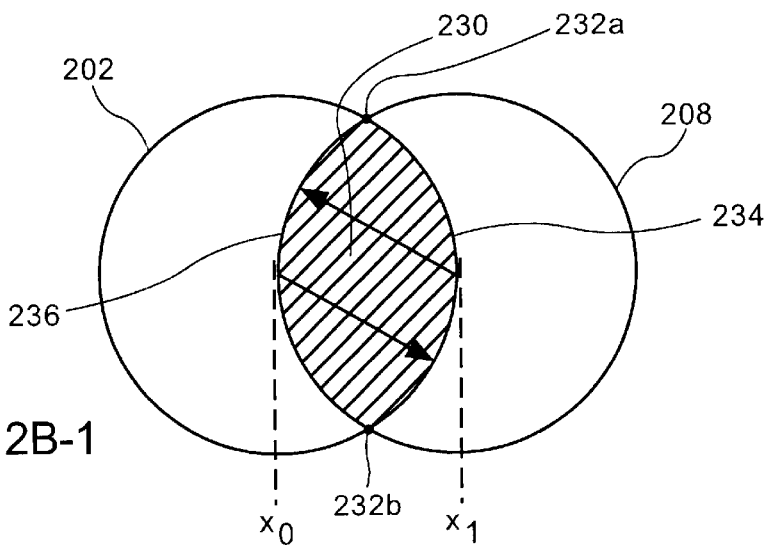
Figures 2, 2B:
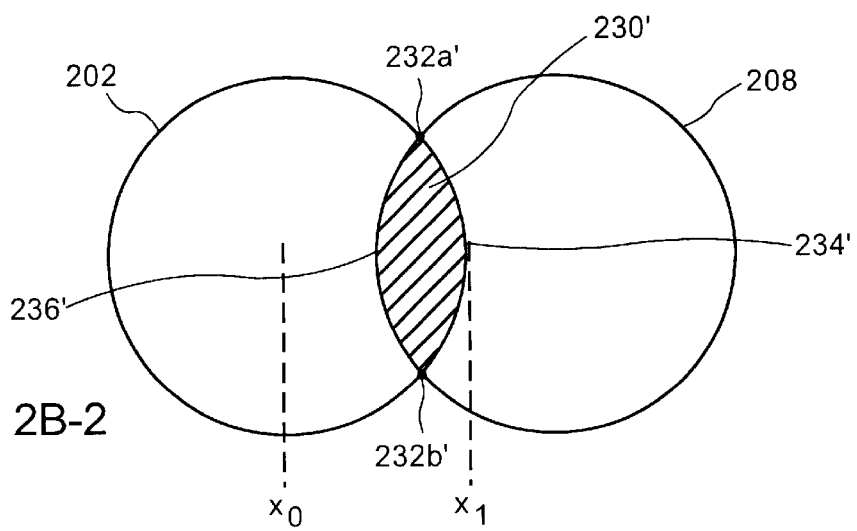
Figures 2, 2B, 3:
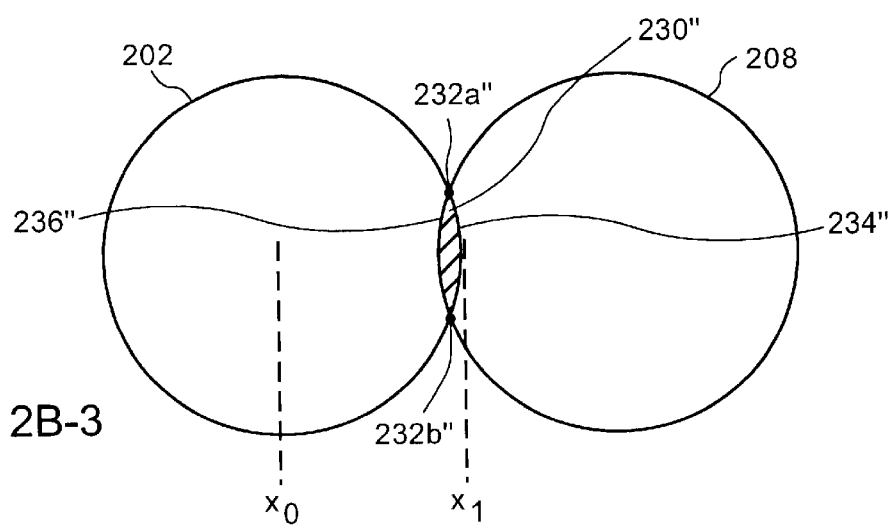

FIGS. 3A-3 and 3A-4 depict a subaperture CMP system 200a', wherein the edge of the primary head 208 has moved from the position $x_0$ to the position $x_1$ while the edge of the secondary head 212 has moved from the position $x_0$ to a position $x_{-1}$, which defines the edge of the wafer 202 in the movement direction 222. The support provided by the co-planer arrangement of the wafer 202 and the retainer ring 204 permitted the primary head 208 and the secondary head 212 to continue polishing the wafer 202 to its very edge without falling off the edge of the wafer 202. Accordingly, the subaperture CMP system 200a' permitted precision polishing of the edge of the wafer 202 by polishing the edge of the wafer 202 to the end.

The embodiment of FIGS. 4A-1 and 4A-2 depict a subaperture CMP system 200b, wherein the edge of the secondary head 212 is positioned at the position $x_0$. In this embodiment, the secondary head 212 is designed to be fixed (from a linear movement standpoint), while it preferably rotates in the direction of preparation 207. In yet another embodiment, the secondary head 212 can be set to stay in a non-rotational configuration. As shown, the edge of the primary head 208 is positioned at the position $x_1$, the edge of the wafer 202 in the movement direction 214. As depicted in the embodiment of FIGS. 4A-3 and 4A-4, the edge of the primary head 208 has linearly moved from the position $x_1$ to the position $x_0$, while the secondary head 212 has remained fixed. Thus, the subaperture CMP system 200b' interjects a great deal of flexibility by allowing the precision polishing of the edge of the wafer 202 prior to polishing the center of the wafer 202 while eliminating the aforementioned edge burn-off effect and/or the pad rebound effect.

Figures 1, 5A:
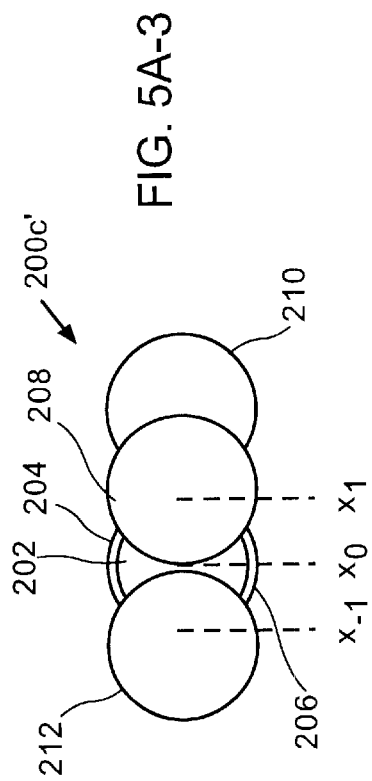
Figures 3, 5A:
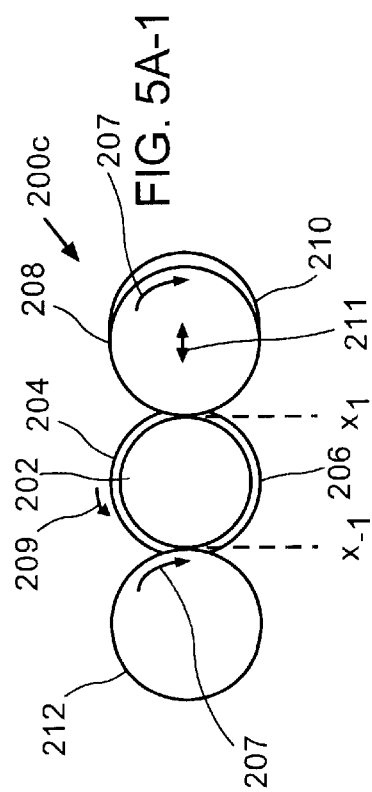
Figures 2, 5A:
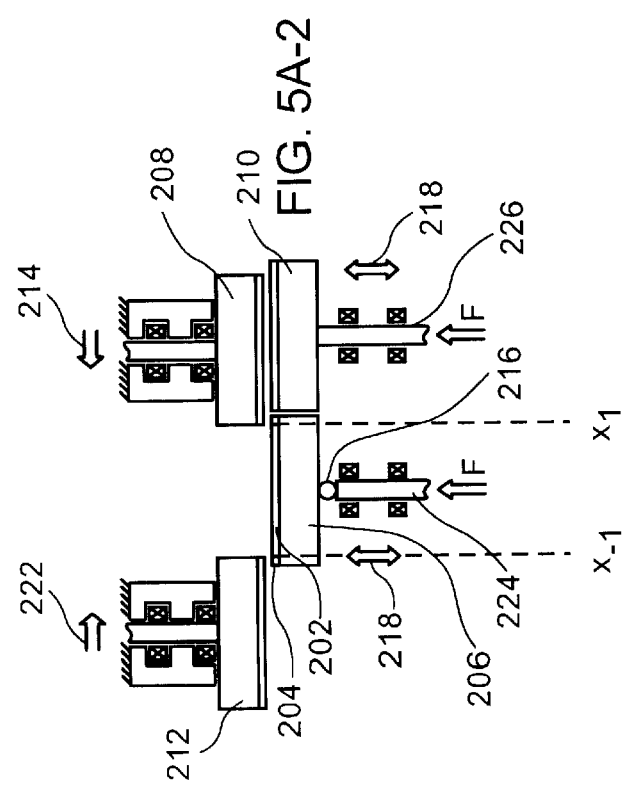
Figures 4, 5A:
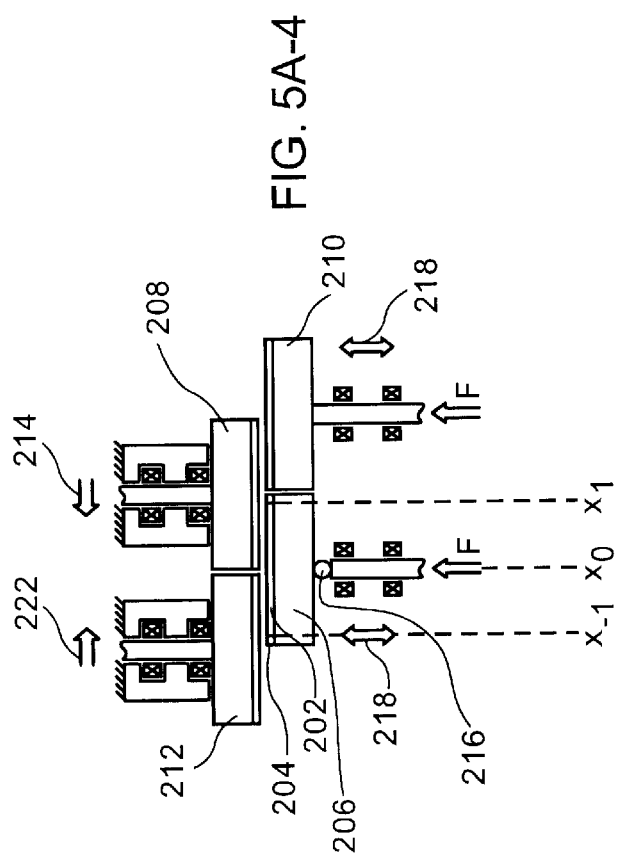

In the embodiment of FIGS. 5A-1 and 5A-2 the primary head 208 is positioned at the position $x_1$, the edge of the wafer 202 in the movement direction 214, while the edge of the secondary head 212 is located at $x_{-1}$, the edge of the wafer 202 in the movement direction 222. Both the primary head 208 and the secondary head 212 are configured to rotate in the direction of preparation 207. Besides rotating, the primary head 208 is defined to linearly move in the movement direction 214 at about the same linear velocity as the secondary head 212 while it linearly moves in the opposite direction, the movement direction 222. In one embodiment, while the secondary head 212 supports the wafer 202 during the time it is being polished by the primary head 208, the secondary head 212 may additionally function as a buffer or a cleaner.

The subaperture CMP system 200c' represents the embodiment of FIG. 5A-1, wherein the primary head 208 and the secondary head 212 have both linearly moved. As depicted, the primary head 208 has moved from the position $x_1$, the edge of the wafer 202 in the movement direction 214 to the position $x_0$, the center of the wafer 202. Concurrently, the secondary head 212 has linearly moved from the position $x_{-1}$ to the position $x_0$. As such, the 200c' system controls the polishing of a particularly targeted region of the surface of the wafer 202, the very edge of the wafer 202, without having to deal with the shortcomings associated with the prior art (i.e., the edge burn-off effect or pad rebound effect).

Figures 1, 6A:
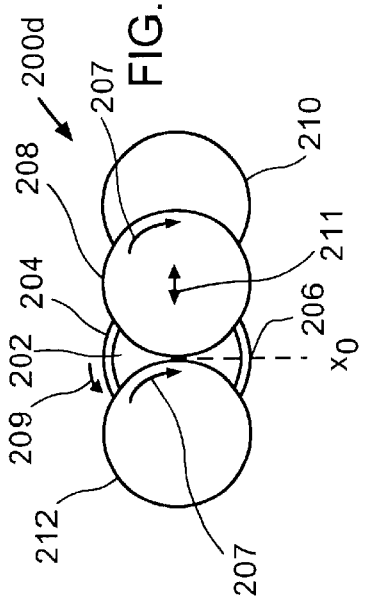
Figures 3, 6A:
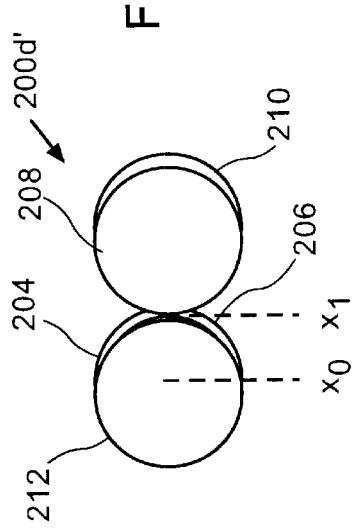
Figures 2, 6A:
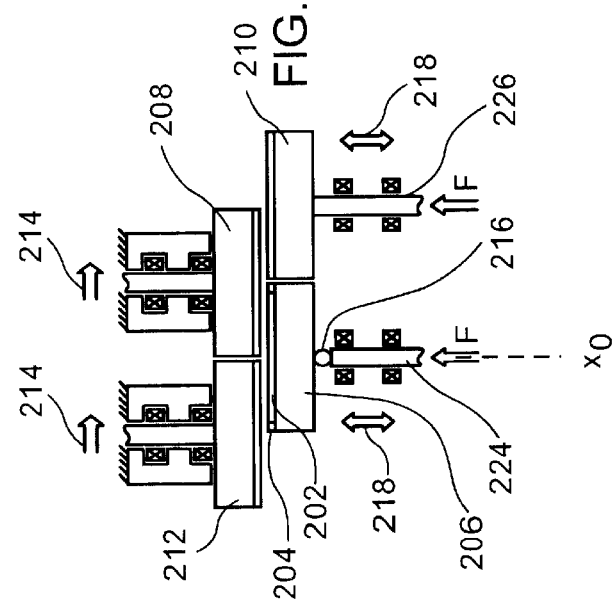
Figures 4, 6A:
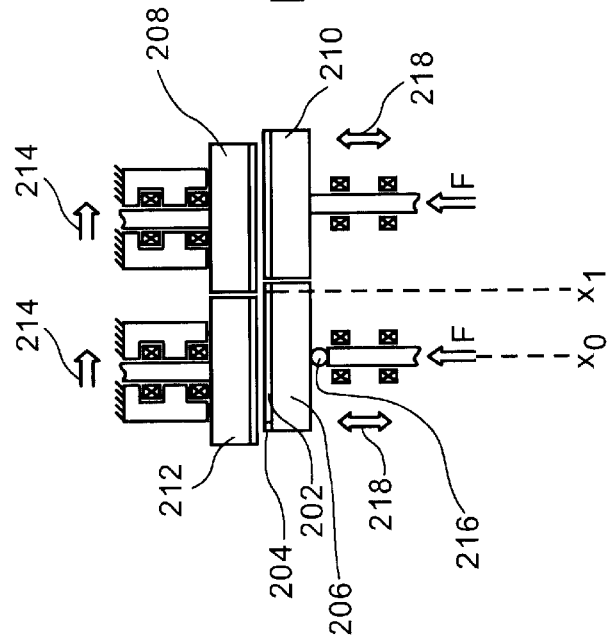

The primary head 208 of the embodiment of FIGS. 6A-1 and 6A-2 is designed to rotate in the direction of preparation 207 while oscillating in the direction of oscillation 211. The primary head 208 is further configured to linearly move in the direction of movement 214. As shown, the edge of the primary head 208 is located at the location $x_0$ thus causing the edge of the secondary head 212 to be located slightly to the left of the position $x_0$. In this embodiment, the secondary head 212 is also designed to rotate at the direction of preparation 207 while it linearly moves in the movement direction 214. In one embodiment, the secondary head 212 may function as a buffer or a cleaner besides supporting the wafer 202 while it is being polished by the primary head 208.

FIGS. 6A-3 and 6A-4 represent the embodiment of FIG. 6A-1 following the primary head 208 linear movement from the position $x_0$ to the position $x_1$. Also shown is the concurrent movement of the secondary head 212 from the position $x_0$ to $x_1$. It must be noted that while moving from the position $x_0$ to the position $x_1$, the linear velocity of the primary head 208 may be about the same as the linear velocity of the secondary head 212. Accordingly, in specific situations, the subaperture CMP system 200d' has the capability of polishing the center of the wafer 202 first, thereby removing surface materials from the center of the wafer 202 prior to removing any materials from the edge region. This capability allows the CMP system to polish the surface of the wafer 202 in order to remove surface materials along a desired topography of the wafer 202. Furthermore, by leaving the polishing of the edge of the wafer 202 to the end, the subaperture CMP system 200d' can exercise a greater control over the removal of surface materials so as to eliminate the drawbacks associated with the prior art.

Figures 3, 7A:
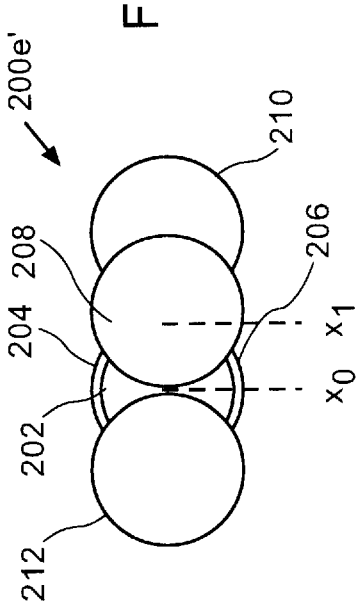
Figures 1, 7A:
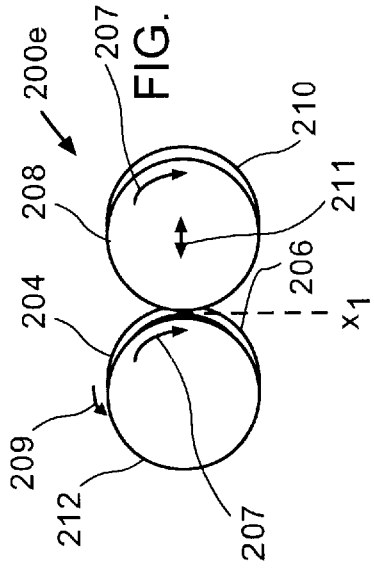
Figures 4, 7A:
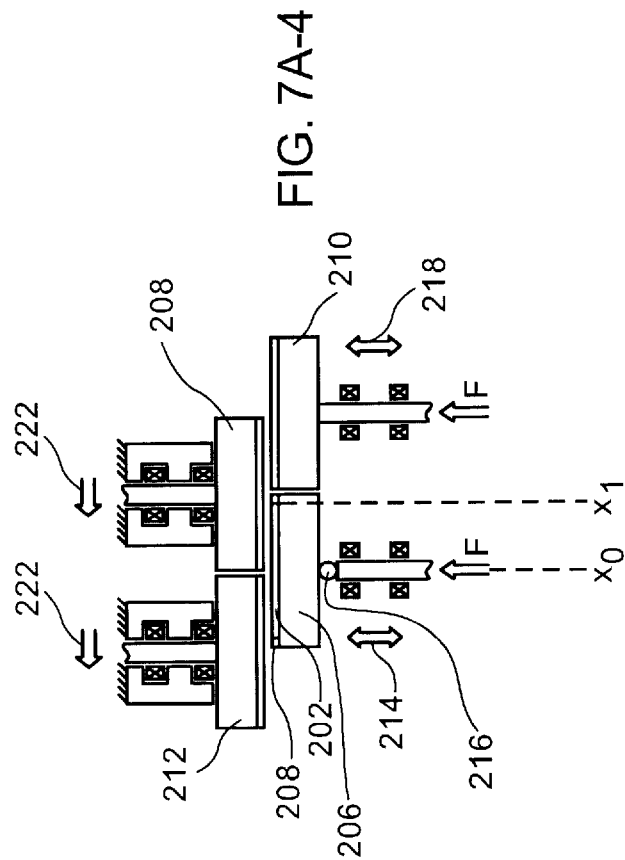
Figures 2, 7A:
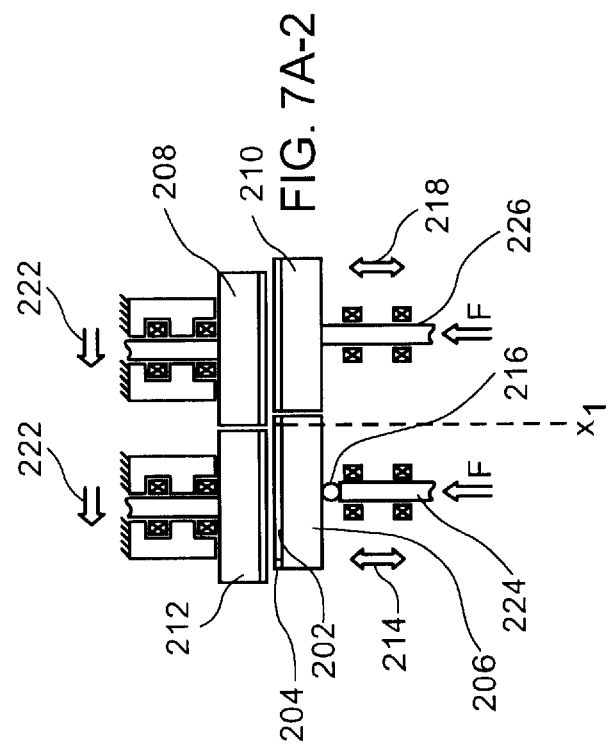

In the subaperture CMP system of 200e, as shown in FIGS. 7A-1 and 7A-2, the edge of the primary head 208 is located at the position $x_1$, the edge of the wafer 202 in the movement direction 214 thus causing the edge of the secondary head 212 to be positioned slightly to the left of the position $x_1$. In this embodiment, the secondary head 212 is designed to linearly move in the movement direction 222 while it rotates. Similarly, the primary head 208 is defined to linearly move at the linear direction 214 while rotating in the preparation direction 207 and oscillating at the direction of oscillation 211. The primary head 208 and the secondary head 212 are designed to move at a comparable linear velocity.

FIGS. 7A-3 and 7A-4 depict the embodiment of FIG. 7A-1 after the primary head 208 and secondary head 212 have concurrently moved in the linear movement direction 222, at a comparable linear velocity. As shown, the edge of the primary head 208 has linearly moved from the position $x_1$ to the position $x_0$ while the edge of the secondary head 212 has also moved from the position $x_1$ to the position $x_0$. FIGS. 7A-3 and 7A-4 reveal a flexible subaperture CMP system, wherein initially, the edge of the wafer 202 is polished without being subjected to the pad rebound effect and edge burn-off effect associated with the prior art.

Figures 1, 8A:
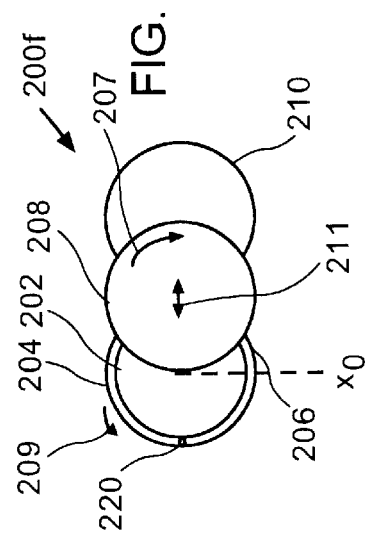
Figures 3, 8A:
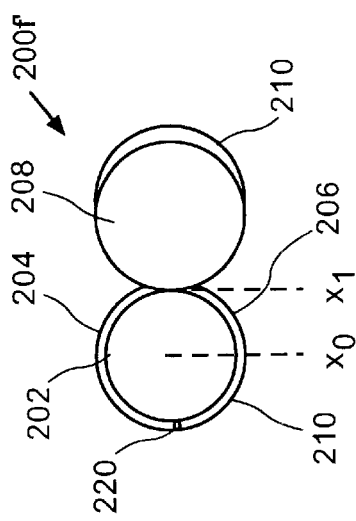
Figures 2, 8A:
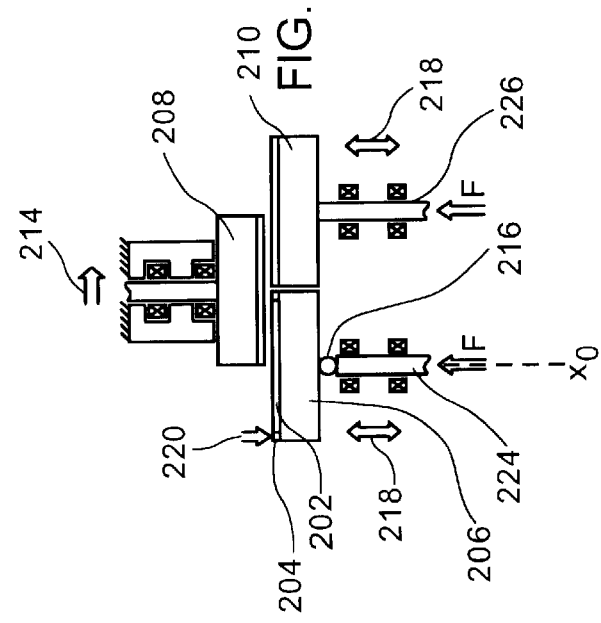
Figures 4, 8A:
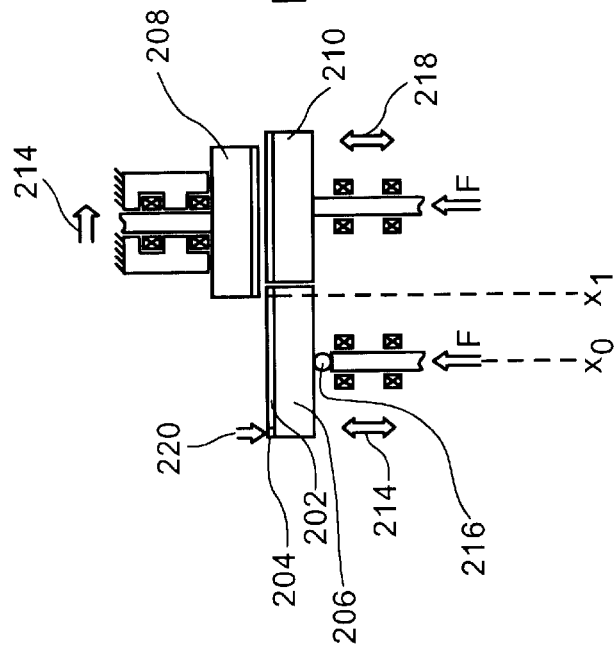

FIG. 8A-1 is a plan view of a subaperture CMP system 200f in accordance with one embodiment of the present invention. The primary head 208 of this embodiment is defined to rotate in the preparation direction 207 while oscillating in the oscillation direction 211. In one embodiment, the subaperture CMP system 200f is designed to preferably include a support point 220 rather than the secondary head 212. The support point 220 is configured to support the retainer ring 204 while the wafer 202 is being polished by the primary head 208. In one embodiment, the support point 220 is positioned at a position symmetrically opposite to the primary head 208 so as to create a moment equal to the moment generated by the rotating primary head 208. In one embodiment, the support point 220 may be designed to be rigid. However, in a different embodiment, the support point 220 may be designed so as to support the retainer ring 204 while the wafer 202 is being polished by utilizing an automatic mechanism configured to create a programmable force comparable to the moment generated by the rotating primary pad 208. The support point 220 may support the wafer 202 utilizing any variety of force output devices including, without limitation, pneumatic output device, hydraulic output device, electromagnetic output device, or mechanical output device. The support point 220 may further be implemented by the use of an open or closed loop system, wherein the resulting forces and/or the feedback can be monitored. In general, any force output device that can generate a programmable force so as to compensate the moment generated by the primary head 208 can be used.

FIG. 8A-2 is a cross-sectional view of the embodiment of FIG. 8A-1, which illustrates the position of the support point 220 with respect to the co-planer relationship of the retainer ring 204 with the wafer 202. As shown, initially, the edge of the primary head 208 is positioned at the position $x_0$, the center of the wafer 202.

The subaperture CMP system 200f' of FIGS. 8A-3 and 8A-4 depict the embodiment of the FIG. 8A-1, wherein the edge of the primary head 208 has moved from the position $x_0$ to the position $x_1$. As shown, the primary head 208 started polishing the wafer 202 at the center of the wafer 202. As the primary head 208 continued polishing the surface of the wafer 202, the support point 220 supported the wafer 202 by imparting a force on the retainer ring 204 so as to compensate for the moment generated by the primary head 208. As a result of the support point 220 supporting the wafer 202, while the wafer 202 was being polished by the primary head 208, the subaperture CMP system 200f' was able to polish the wafer 202 to its very edge without facing the shortcomings associated with the prior art.

Figures 3, 9A:
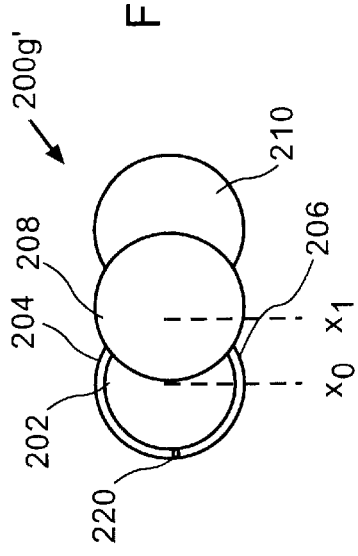
Figures 4, 9A:
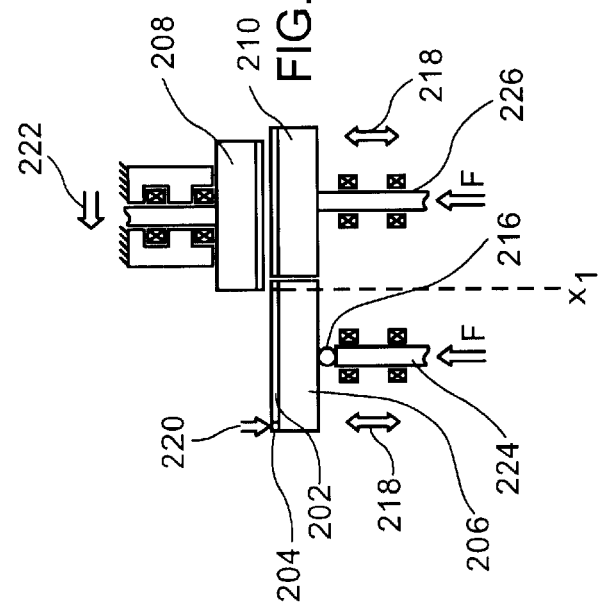
Figures 1, 9A:
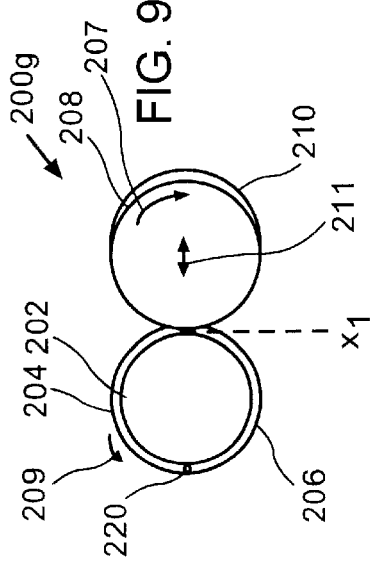
Figures 2, 9A:
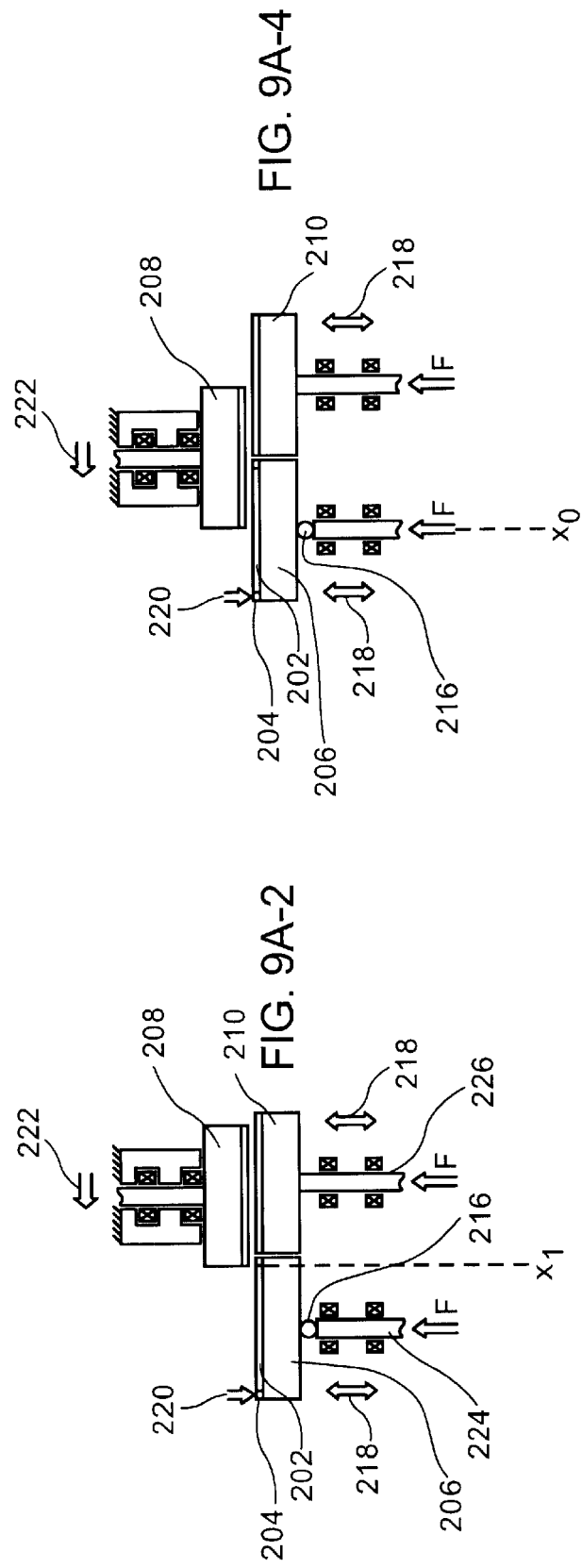

In the embodiment of FIGS. 9A-1 and 9A-2 the support point 220 applies force on the retainer ring 204 while the retainer ring 204 holds the wafer 202 being polished by the primary head 208. In this embodiment, the edge of the primary head 208 is positioned at the position $x_1$ while the support point 220 is positioned at a symmetrically opposite point on the retainer ring 204. As shown in the embodiment of FIGS. 9A-3 and 9A-4, the primary head 208 has moved in the movement direction 222 from the position $x_1$, the edge of the wafer 202, to the position $x_0$, the center of the wafer. Thus enabling the subaperture CMP system 200g' to polish the very edge of the wafer 202 without confronting the pad rebound effect and edge burn-off effect associated with the prior art.

Figures 3, 10A:
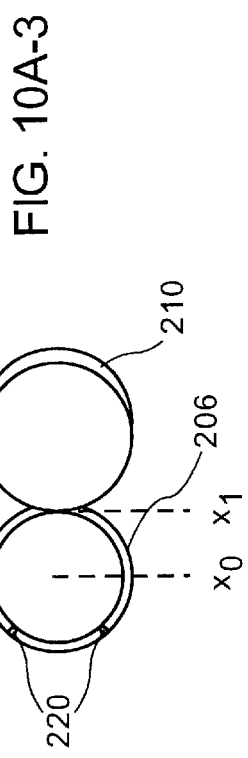
Figures 1, 10A:
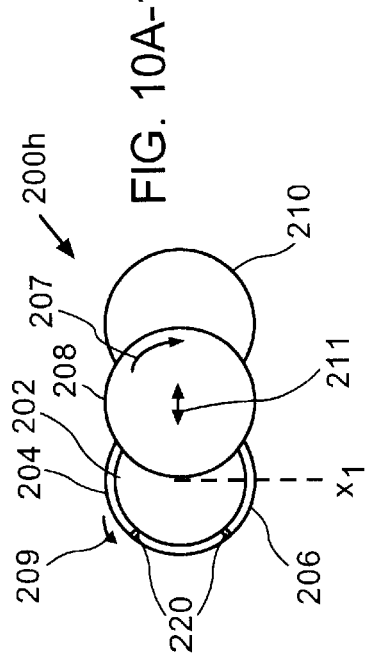
Figures 4, 10A:
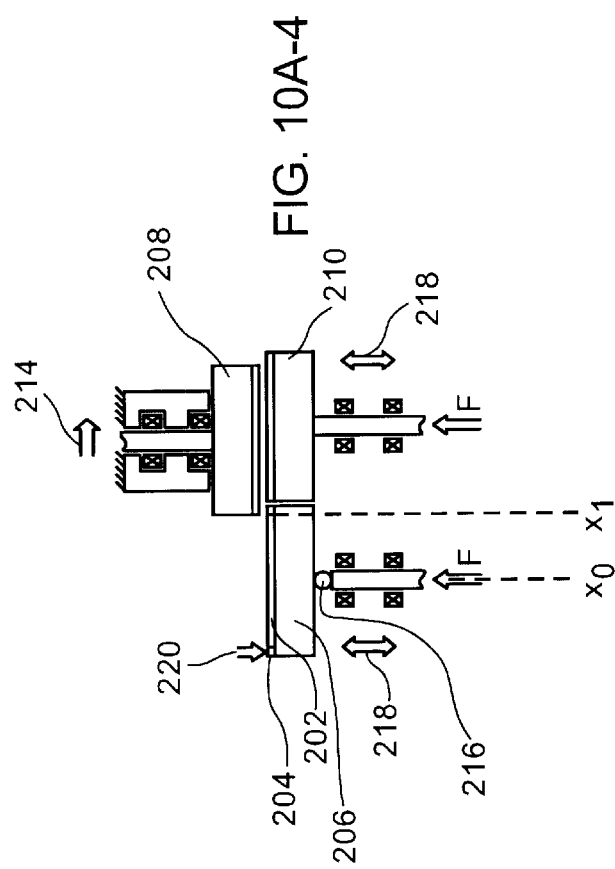
Figures 2, 10A:
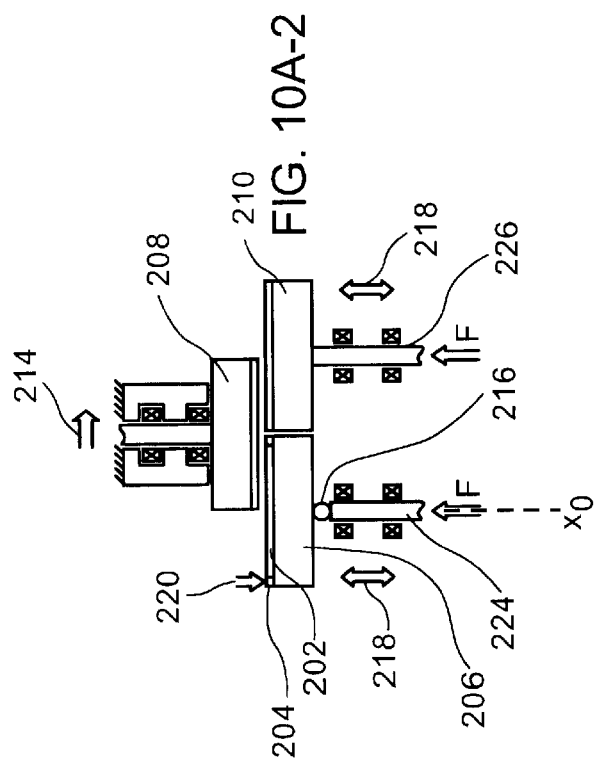

In one embodiment of a subaperture CMP system 200h, a plurality of support points 220 may be implemented. As depicted in the embodiments of FIGS. 10A-1 and 10A-2, two support points 220 have been used to apply force on the retainer ring 204 while the retainer ring 204 holds the wafer 202 as it is being polished by the primary head 208. In this embodiment, the edge of the primary head 208 is positioned at the position $x_0$, while the support points 220 are positioned on opposite positions on the retainer ring 204. The multiple support points 220 support the retainer ring 204 and, thereby the wafer 202 by generating a moment comparable to that of the primary head 208.

The benefits of utilizing multiple support points 220 become evident particularly when the primary head 208 is polishing the edge of the wafer 202. The embodiment of FIGS. 10A-3 and 10A-4 depict a subaperture CMP system 200h', wherein the edge of the primary head 208 has moved from the position $x_0$ to the position $x_1$. As shown, the support points 220 supported the retainer ring 204 and, thereby the wafer 202 while the primary head 208 moved from the position $x_0$ to the position $x_1$, the edge of the wafer 202. The co-planer relationship of the retainer ring 204 with the wafer 202 in conjunction with the support provided by the support points 220 have allowed the polishing head 208 to polish the wafer 202 to the very edge without falling off the edge of the wafer 202.

Figures 1, 11A:
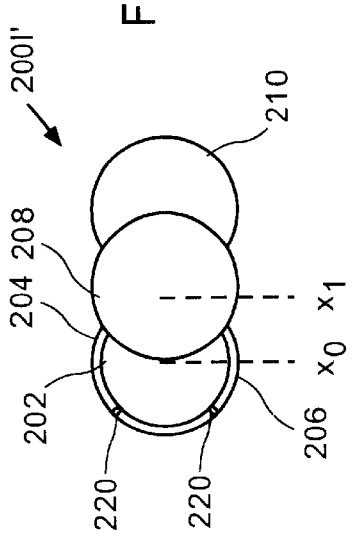
Figures 2, 11A:
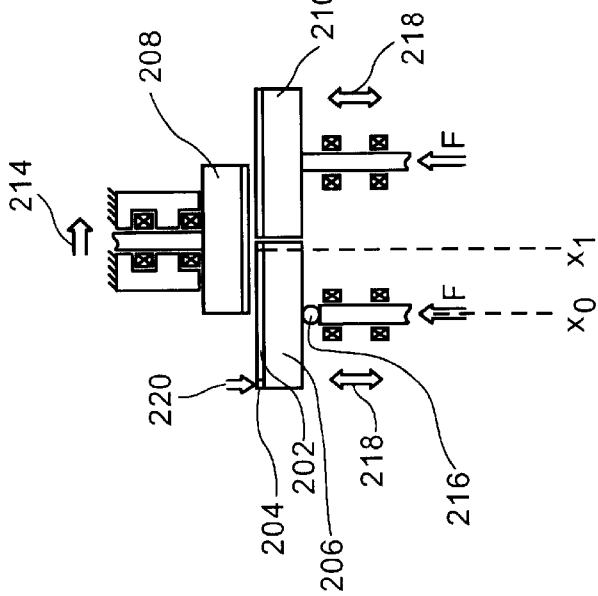
Figures 3, 11A:
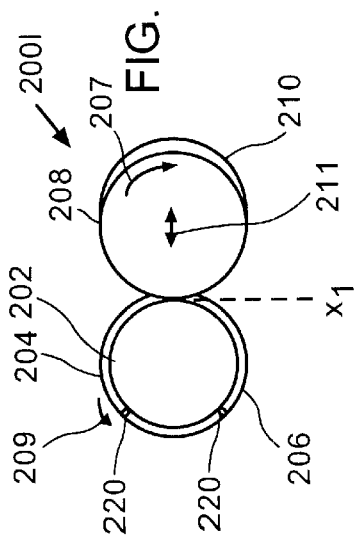
Figures 4, 11A:
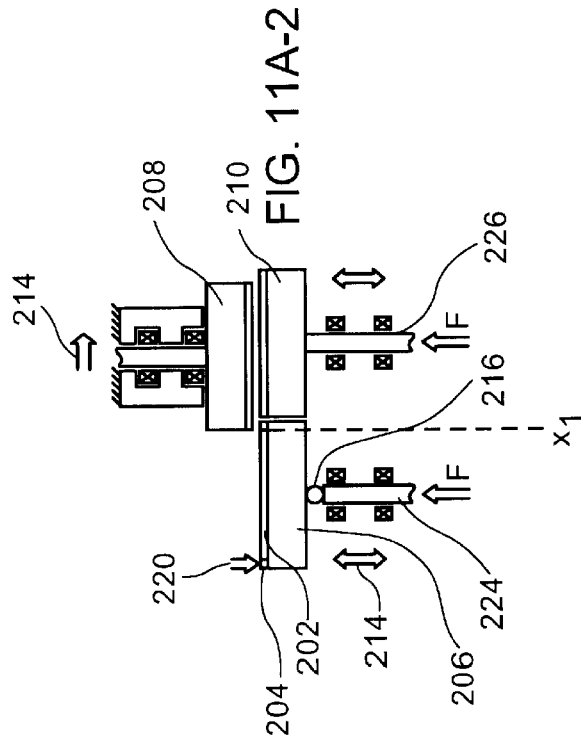

FIGS. 11A-1 and 11A-2 depict a subaperture CMP system in accordance with yet another embodiment of the present invention. This embodiment also implements a plurality of support points 220, which apply force on the retainer ring 204 while it holds the wafer 202 as the wafer 202 is being polished by the primary head 208. In this embodiment, the edge of the primary head 208 is positioned at the position $x_1$, while the multiple support points 220 are located on opposite positions on the retainer ring 204. As shown in the embodiment of FIGS. 11A-3 and 11A-4, the primary head 208 has moved from the position $x_1$ to the position $x_0$. The multiple support points 220 enabled the primary head 208 to start polishing at the very edge of the wafer 202 without creating any pad rebound effect or edge burn-off effect.

Figure 12:
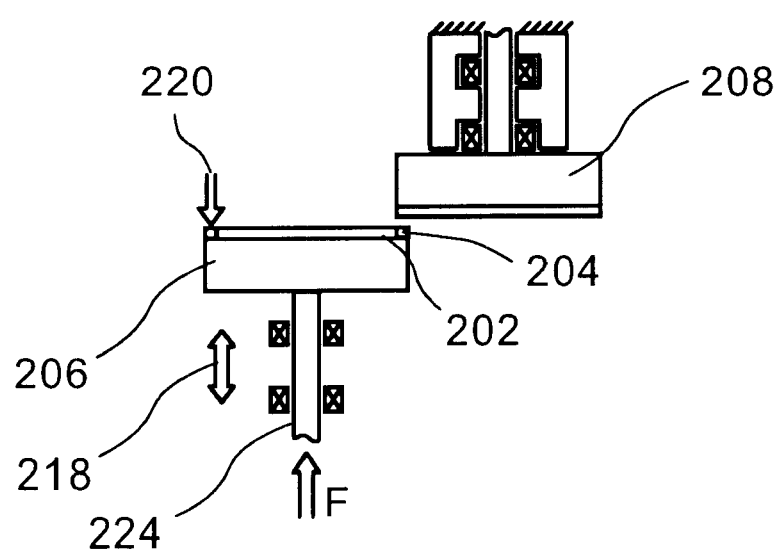
FIG. 12 is a cross-sectional view of a non-gimbaled subaperture CMP system, in accordance with still another embodiment of the present invention.

FIG. 12 depicts a non-gimbal exemplary embodiment of the present invention. As shown, the carrier 206 is situated on the extending spindle 224 while engaging the retainer ring 204, which holds the wafer 202. The support point 220 applies force on the retainer ring 204 while the primary head 208 polishes the wafer 202. This implementation, preferably, requires the utilization of a primary head 208, which can adjust to the carrier head 206 as the primary head 208 is being applied on the carrier head 206. Specifically, the primary head 208 is configured to properly apply appropriate amount of force on the carrier head 206 so as to prevent improper angled contact of the primary head 208 with the carrier 206.

It should be appreciated that the present invention may be implemented in a manner so as to include a system to monitor the finishing layer thickness (e.g., such as any one or more layers/films being prepared/polished), material removal rate, and/or finishing layer profile. However, such monitoring systems have not been shown in the above-mentioned Figures. Furthermore, although in the exemplary above-mentioned embodiments the wafer 202 and the other components were oriented horizontally, the present invention may be implemented in a manner so that the wafer 202 is oriented in any attitude (i.e., pitch or roll). Lastly, the present invention may be implemented so that all axis motions, forces, flows, and process parameters may be fully programmable.

Although the foregoing invention has been described in some detail for purposes of clarity of understanding, it will be apparent that certain changes and modifications may be practiced within the scope of the appended claims. For instance, the embodiments are applicable to any substrate, such as, storage media disks, semiconductor wafers (e.g., 200 mm wafers, 300 mm wafers, etc.), and any other type of substrate requiring polishing, planarization, buffing, or other suitable preparation operations. Accordingly, the present embodiments are to be considered as illustrative and not restrictive, and the invention is not to be limited to the details given herein, but may be modified within the scope and equivalents of the appended claims.

What is claimed is:

1. A chemical mechanical polishing system (CMP), comprising:

a carrier having a top surface and a bottom region, the top surface being configured to hold and rotate a wafer having a wafer surface that has one or more formed layers to be prepared; and a preparation head having a preparation surface, the preparation head being configured to oscillate at a programmable rate while linearly moving between a center of the wafer and an edge of the wafer, and be applied to the wafer surface, such that less than an entire portion of the preparation surface of the preparation head overlaps less than an entire portion of the wafer surface.

2. A chemical mechanical polishing system (CMP) as recited in claim 1, wherein the carrier is configured to rotate in the wafer rotation direction.

3. A chemical mechanical polishing system (CMP) as recited in claim 2, wherein the preparation head is designed to rotate in the direction of preparation, the direction of preparation being configured to be a rotation direction opposite to the wafer rotation direction.

4. A chemical mechanical polishing system (CMP) as recited in claim 1, wherein the preparation head is designed to linearly move in a direction of the center of the wafer to the edge of the wafer as well as a direction of the edge of the wafer to the center of the wafer.

5. A chemical mechanical polishing system (CMP) as recited in claim 1, further comprising:
a gimbal being secured to the bottom region of the carrier, the gimbal being configured to adjust the carrier while the carrier is receiving the preparation head.

6. A chemical mechanical polishing system (CMP) as recited in claim 1, further comprising:
a retainer ring being engaged on the top surface of the carrier, the retainer ring being configured to hold the wafer.

7. A chemical mechanical polishing system (CMP) as recited in claim 1, further comprising:
a conditioning head being positioned beside the carrier, the conditioning head having a conditioning surface that is substantially planar with the wafer surface and is designed to deliver or receive the preparation surface of the preparation head as the preparation surface of the preparation head is caused to be moved onto the wafer surface or onto the conditioning surface of the conditioning head.

8. A chemical mechanical polishing system (CMP) as recited in claim 7, wherein the conditioning head is configured to rotate in the direction of preparation.

9. A chemical mechanical polishing system (CMP) as recited in claim 1, further comprising:
a support being located above the carrier, the support being configured to provide support to the wafer surface.

10. A chemical mechanical polishing system (CMP) as recited in claim 9, wherein the support can be one of a secondary head and at least one support point.

11. A chemical mechanical polishing system (CMP) as recited in claim 10, wherein the secondary head is configured to be applied to at least a portion of the wafer surface that is less than the entire portion of the wafer surface.

12. A chemical mechanical polishing system (CMP) as recited in claim 11, wherein the secondary head is configured to rotate in the preparation direction.

13. A chemical mechanical polishing system (CMP) as recited in claim 12, wherein the secondary head is configured to linearly move in a direction between about the center of the wafer and the edge of the wafer as well as the direction between about the edge of the wafer and the center of the wafer.

14. A chemical mechanical polishing system (CMP) as recited in claim 10, wherein the secondary head is configured to be one of a buffer and a cleaner.

15. A chemical mechanical polishing system (CMP) as recited in claim 10, wherein the support point is configured to apply force on the retainer ring so as to provide support to the wafer surface.

16. A chemical mechanical polishing system (CMP), comprising:
a carrier being designed to hold and rotate a substrate at a fixed location, the substrate having a surface to be prepared;
a primary head having a surface, the primary head being configured to oscillate at a programmable rate while linearly moving over the fixed location of the rotating carrier in one of a first direction beginning at about a center of the surface to be prepared of the substrate to about an edge of the surface to be prepared of the substrate and a second direction beginning at about the edge of the surface to be prepared of the substrate to about the center of the surface to be prepared of the substrate, such that less than an entire portion of the surface of the primary head is configured to be applied to the surface to be prepared of the substrate overlapping at least less than an entire portion of the surface to be prepared of the substrate.

17. A chemical mechanical polishing system (CMP) as recited in claim 16, wherein the carrier is designed to rotate in a wafer rotation direction.

18. A chemical mechanical polishing system (CMP) as recited in claim 17, wherein the primary head is configured to rotate in a direction of preparation, the direction of preparation being defined as a rotation direction opposite to the wafer rotation direction.

19. A chemical mechanical polishing system (CMP), comprising:
a carrier having a top surface and a bottom region, the top surface being configured to hold and rotate a wafer having a surface that has one or more formed layers to be prepared;
a preparation head having a preparation surface, the preparation head being configured to oscillate at a programmable rate while linearly moving between a center of the wafer and an edge of the wafer and further configured to be applied to the wafer surface, such that the preparation surface of the preparation head overlaps at least a portion of the wafer surface that is less than an entire portion of the wafer surface; and
a conditioning head being positioned adjacent to the carrier, the conditioning head having a conditioning surface that is substantially planar with the wafer surface and is designed to deliver or receive the preparation surface of the preparation head as the preparation surface of the preparation head is caused to be moved onto the wafer surface or onto the conditioning surface of the conditioning head.

20. A chemical mechanical polishing system (CMP) as recited in claim 19, wherein the carrier is configured to rotate in the wafer rotation direction, and the preparation head is designed to rotate in the direction of preparation, the direction of preparation being configured to be a rotation direction opposite to the wafer rotation direction.

21. A chemical mechanical polishing system (CMP) as recited in claim 19, further comprising:
a gimbal being secured to the bottom region of the carrier, the gimbal being configured to adjust the carrier while the carrier is receiving the preparation head.

22. A chemical mechanical polishing system (CMP), comprising:
a carrier being designed to hold and rotate a substrate at a fixed location, the substrate having a surface to be prepared;
a primary head having a surface, the primary head being configured to oscillate at a programmable rate while linearly moving over the fixed location of the rotating carrier in a to direction beginning at about a center of the surface to be prepared of the substrate to about an edge of the surface to be prepared of the substrate, such that less than an entire portion of the surface of the primary head is applied to the surface to be prepared of the substrate overlapping less than an entire portion of the surface to be prepared of the substrate.

* * * * *